(12) United States Patent
Boylan et al.

(10) Patent No.: US 6,877,145 B2
(45) Date of Patent: Apr. 5, 2005

(54) AUTOMATIC GENERATION OF INTERCONNECT LOGIC COMPONENTS

(75) Inventors: Sean Boylan, Rahoon (IE); Derek Coburn, Dundalk (IE); Tadhg Creedon, Furbo (IE); Denise De Paor, Carraroe (IE); Vincent Gavin, Galway (IE); Kevin J Hyland, Dublin (IE); Suzanne M Hughes, Galway (IE); Kevin Jennings, Ballinasloe (IE); Mike Lardner, Tuam (IE); Brendan Walsh, Galway (IE)

(73) Assignee: 3Com Corporation, Santa Clara, CA (US)

( * ) Notice: Subject to any disclaimer, the term of this patent is extended or adjusted under 35 U.S.C. 154(b) by 666 days.

(21) Appl. No.: 09/919,806

(22) Filed: Aug. 2, 2001

(65) Prior Publication Data

US 2003/0018738 A1 Jan. 23, 2003

(30) Foreign Application Priority Data

Feb. 28, 2001 (GB) .............................................. 0104945

(51) Int. Cl.$^7$ ............................................... G06F 17/50
(52) U.S. Cl. ............................. 716/12; 716/17; 716/18; 716/6; 703/14; 703/21; 703/19
(58) Field of Search ............................ 703/14, 21, 9; 716/3, 19, 17, 18, 12, 13, 4; 709/213

(56) References Cited

U.S. PATENT DOCUMENTS 5,563,800 A * 10/1996 Matsumoto et al. ........... 716/3
5,633,807 A * 5/1997 Fishburn et al. .............. 716/19

FOREIGN PATENT DOCUMENTS

GB 2209857 A 5/1989

* cited by examiner

Primary Examiner—Jack A. Lane
(74) Attorney, Agent, or Firm—Nixon & Vanderhye P.C.

(57) ABSTRACT

A program tool automatically generating interconnect logic for a system-on-a-chip is based on a library of operational cores and on a architecture which requires all data exchange between cores to proceed via shared memory, which may be 'off-chip'. The architecture includes a data aggregation technique for access to memory with successive levels of arbitration.

10 Claims, 13 Drawing Sheets

Sample Register Path Diagram

FIG. 5

AUTOMATIC GENERATION OF INTERCONNECT LOGIC COMPONENTS

FIELD OF THE INVENTION

This invention relates to the generation of large scale integrated circuits and particularly to the layout of a 'system-on-a-chip'.

BACKGROUND TO THE INVENTION

There are various program tools used in the generation of large scale integrated circuits that use libraries of re-useable elements, examples are layout tools with memory libraries. In the case of these tools one still has to hand-code how the individual elements are connected together. A new design using the same set of libraries elements but a different interconnect hierarchy or architecture requires the designer to hand code this interconnect logic afresh.

SUMMARY OF THE INVENTION

The present invention partly relies on a library of reusable elements but automates the generation of the interconnect logic. This permits automatic generation of new and different realisations of the architecture.

The preferred architecture means that substantially all data exchange between core blocks is via a central shared memory (or group of memories) that could be on-chip and/or off-chip. This means that if for example an Ethernet core and a PCI core have to pass data to each other then the data would be copied into memory from and by the Ethernet core and copied out of memory by the PCI core.

Access to memory is a limited resource. Preferably therefore the invention accommodates a hierarchical data aggregation technique whereby read and write requests go through successive levels of arbitration in order to gain access to memory. This has two main advantages. It allows dispersal of routing bottlenecks and enables the use of the lowest possible frequency clocking for each operational function.

Preferably there is a separation of data paths from register paths. Data handling cores communicate with memory via a data path. Register paths are between processor cores and other cores. It is possible to have multiple register paths from processor cores to groups of cores. This allows the grouping of cores on a particular register path based on such parameters as bandwidth and access latency.

BRIEF DESCRIPTION OF THE DRAWINGS

FIG. 5 is a table of states for a state machine

DETAILED DESCRIPTION

Figure 1:
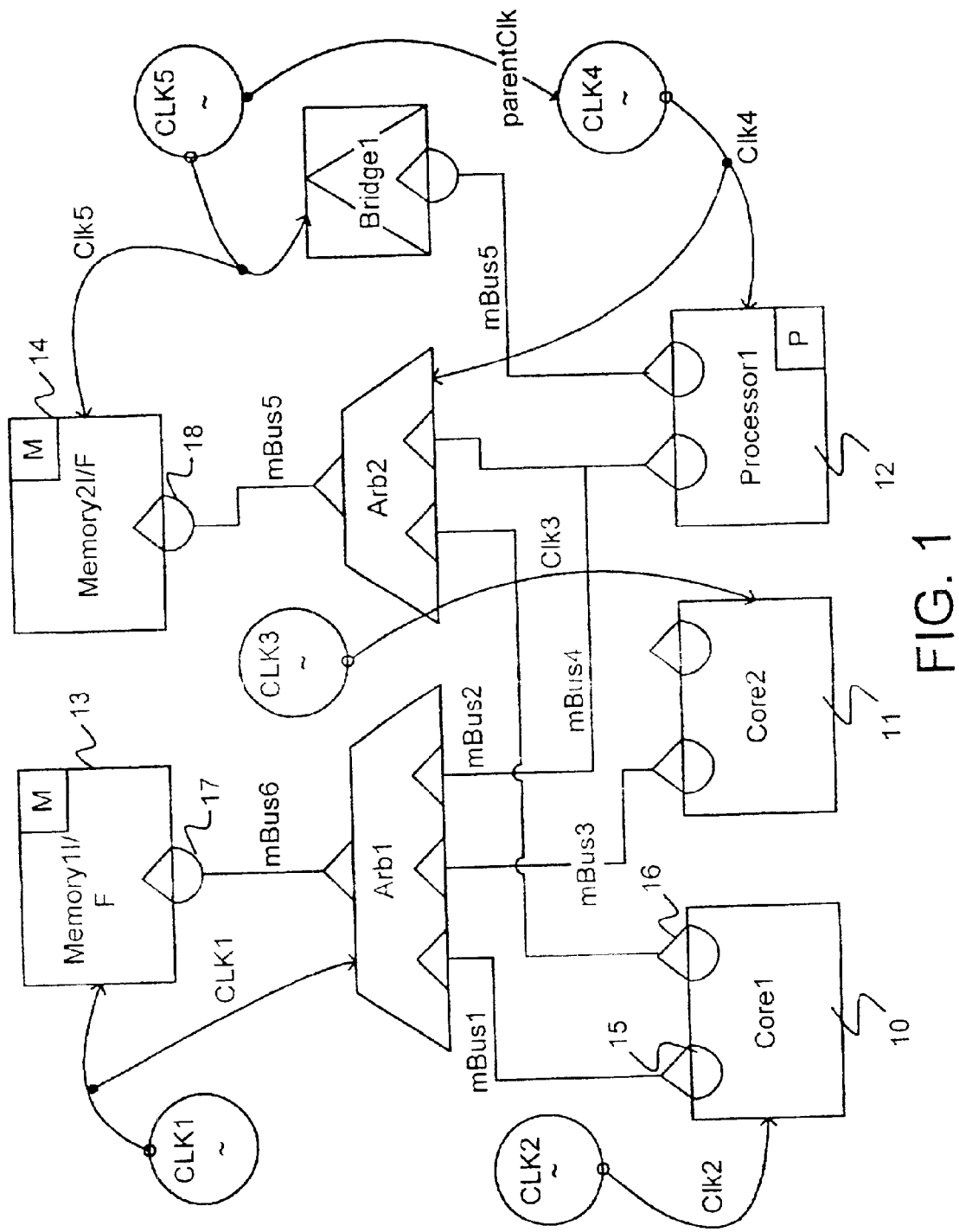
FIG. 1 is a data path diagram

For a plurality of interconnected devices in an system-on-a-chip or similar application, a scheme according to the invention infers automatically appropriate logic functions, such as arbiters, inter-clock-domain boundary buffering and alignment, clocking mechanisms. Interconnections may be depicted graphically or otherwise.

The key to developing systems quickly is the separation of the interconnect logic and the basic operational blocks, herein called 'cores'. These cores will not need to be altered for each system, only the set of cores and the way they interconnect need change. The following description describes how the generation of this interconnect logic (which is preferably expressed in HDL/Verilog) can be automated.

The inputs needed in a preferred example to automatically generate the interconnect logic are as follows:

A library of reuseable cores with key parameters defined, from which library cores can be selected.

A set of rules defining how cores can be connected together.
1. Interconnect logic blocks (clock generator, arbitration, register bridge) and their configurable parameters.
2. A method of describing how the cores need to be connected. This could be achieved using a spreadsheet or as preferred a graphical picture showing the cores and how they are connected together, as shown for example in FIG. 1, FIG. 2 and FIG. 3.
3. Generic Verilog/HDL for each of the interconnect blocks to which the parameters can be applied to create the specific interconnect logic for the system being designed.

Using these inputs a set of algorithms will be applied in order to create the system's interconnect logic. There are effectively three generic types of algorithms that can be applied in order to create the logic.

(A) Parameterisable Verilog/HDL—where all that needs to be done is to define the value of a set of parameters.

(B) Verilog Templates are used where the same functionality needs to be repeated a number of times. Examples are generation of select line logic (select 1 of N blocks connected via the same bus) or multiple instances of the same interface logic (e.g. an arbitration block with 5 memory bus connections).

(C) State Machine Algorithms wherefor all the Verilog/HDL is generated. The algorithm decides the number of states in the state machine and the value of all signals in the state machine.

In order to generate the logic associated with a particular interconnect block it may be necessary to apply combinations of these algorithms one or more times. The Verilog or HDL modules will be created for each of the interconnect blocks shown graphically in the interconnect diagrams or otherwise. A top level Verilog instantiation file with be created incorporating each of the interconnect blocks and core wrappers. This file will declare an instance for the generated modules (arbitration, register bridge etc.). It will declare an instance for each of the core wrappers. The Verilog instantiation file will reflect a completely flat hierarchy with all modules being declared at the same level. This will be the starting point used to create selectable hierarchies.

Figure 2:
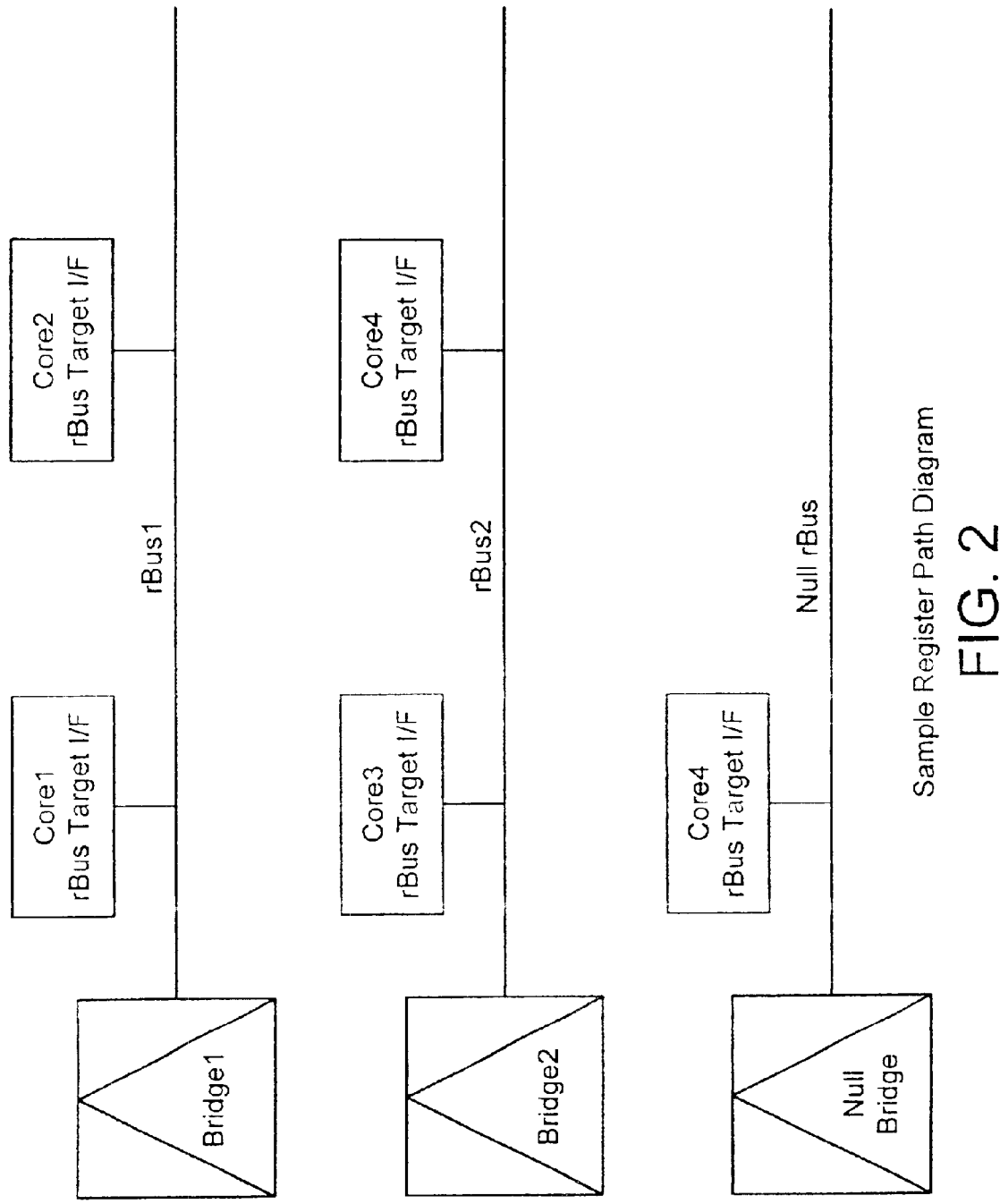
FIG. 2 is a register path diagram
Figure 3:
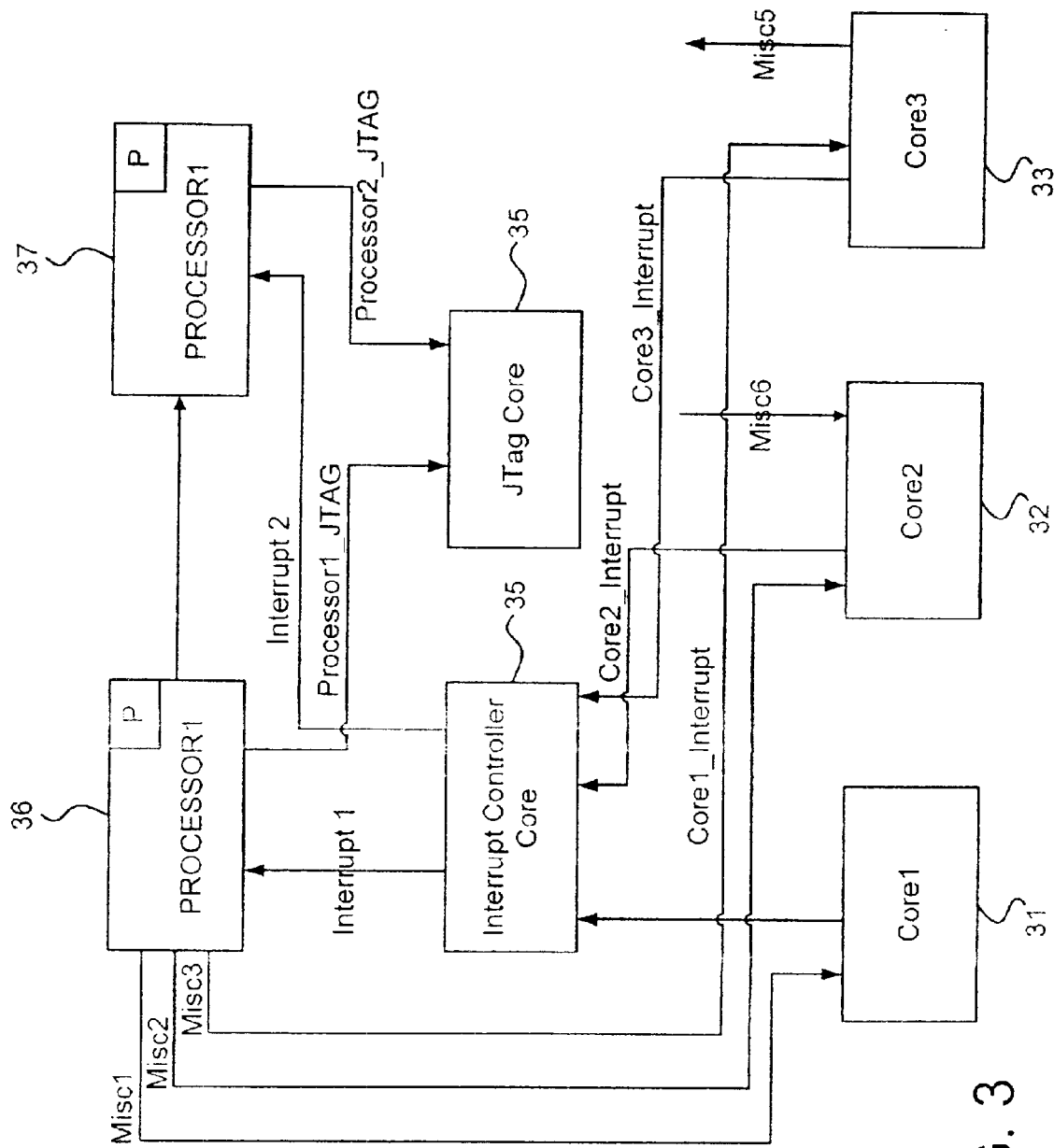
FIG. 3 is a control path diagram

FIGS. 1, 2 and 3 are diagrams illustrating specifically a data path, a register path and a control path for a specific system. Each of them relies on the obtaining of basic elements, such as cores and memory interfaces, from a library and the layout tool which will be described later is employed to generate the interconnect logic including arbitrators and bridges for the selected system which is to be designed using elements from the memory.

In the data path diagram shown in FIG. 1 there are two cores 10 and 11, denoted 'Core1' and 'Core2' respectively and a processor core 12, denoted 'Processor1' and two interfaces, the Memory1 interface 13 and the 'Memory2' interface 14. Herein the term 'data' is used to denote the information on which the system operates. In the example of a network switch, it is principally constituted by packet data, which may be either address data or message data. The 'register' path is essentially employed for enabling a processor core to control or monitor the status of other processors or cores by writing and/or reading signals into or out or control of status registers in those other cores or processors. The control path is employed for such ancillary functions such as interrupts, resets and suchlike.

In FIG. 1 Core1 is to be able to direct data transactions, such as reading and writing to both the memory interface 13 and the memory interface 14. 'Core2' is to be able to direct data transactions only to the memory interface 13. Processor1 can not only direct data transactions to the memory interfaces 13 and 14 but differs generically from the other cores in that it may also exchange register transactions with registers of cores or processors not shown in FIG. 1.

It is generally convenient to employ a register bus system which is different in organisation (such as in respect of number of lines, bandwidth, operating speed etc.) from the bus system which is employed for data transactions. However, it is also convenient to employ processors which produce register transactions in a form compatible with the memory bus system. If this be so, it is necessary to employ a bridge, such as 'Bridge1' which effects translation of register transactions (data intended for writing in or read from registers, together with associated requests acknowledgements and control signals) to and from the format required for the memory bus from and to respectively the format required for the register bus.

The interconnect logic as far as the data path is concerned in FIG. 1 comprises various sections of memory bus, denoted mBus1, mBus2 etc. and the arbitration blocks, shown as Arb1 and Arb2. These arbitration blocks aggregate the memory bus sections that extend towards the cores into a respective common memory bus section proceeding towards the memory, or another stage of arbitration if that be necessary. The arbitrators need to buffer requests for the reading and writing of data. In general it is desirable to allow the various sections of the memory bus to have a data width and/or an operating speed matched to the respective core. The arbitrator needs to have its common bus, such as mBus6 for Arb1 and mBus7 for Arb2, capable of operating at a greater data rate than any of the individual data rates on the buses which extend between the arbitrator and the respective cores. Furthermore, the arbitrator needs to determine, for example by way of a round-robin algorithm, the order in which requests received on the various memory bus sections will be forwarded onto the respective memory interface.

Also shown in FIG. 1 are clock generating circuits denoted CLK1, CLK2 etc. The architecture envisaged in the present invention assumes that a system or parent clock will be subdivided to provide a local integral sub-harmonic clock for each of the cores, as described for example in co-pending application Ser. No. 0104829 3 filed Feb. 27, 2001.

FIG. 2 is a simple example of a register path diagram wherein a 'Bridge1' (e.g. the same bridge as shown in FIG. 1) is coupled by a register bus 'rBus1' to target interfaces in two cores, 'Core1' and 'Core2'. The target interfaces are coupled to registers not shown. Likewise another bridge, 'Bridge2' is coupled by a second register bus to target interfaces in two further cores, 'Core3' and 'Core4'. The diagram includes a 'Null Bridge' notionally coupled by a Null rBus to a target interface in 'Core5'. The significance of a null is that the respective target interface is not intended to exchange register transactions with the bus to which the 'null bridge' is connected.

FIG. 3 is an example of a control path diagram showing paths of control signals between various cores 31–35 and processor 36 and 37. The signal paths denote 'interrupt' or 'reset' or misc(ellaneous) according to their purpose.

Diagram Rules

The following is a preferred list of the rules that will be enforced as a user creates the three diagrams (data, register and control) that describe the interconnect logic that will be generated. Rules may be added and removed from the tool as necessary or advised.

Data Diagram Rules

Since data transactions are conveyed by a memory bus (mBus) the data path will henceforth by referred to as the mBus.

1.1. One may have only the following elements in a data diagram. These are cores, such as the elements 10–12 a register bridge, such as 'Bridge1' in FIG. 1, mBus initiator ports, such as shown at 15 and 16 for Core1 in FIG. 1, arbiters, such as Arb1 and Arb2 in FIG. 1, mBus target ports, such as those shown at 17 and 18 in FIG. 1 and clock generators, e.g. CLK1, CLK2 etc. shown in FIG. 1.
1.2. One must have at least one core with an initiator port and one core with a target port.
1.3. One may have only a specified maximum of cores (as explained below).
1.4. One may have multiple instances of the same core.
1.5. A core may have both an mBus initiator and mBus target interface. The following rules will apply in this case.
   a) Targets and initiator interfaces will be represented separately on the diagram.
   b) Both interfaces will use the same name and unique identifier.
   c) Only one of the interfaces can have a clock generator connected to it.
1.6. One may have any number of arbitration, register bridge and clock generator blocks.
1.7. An initiator is connected to target(s) and/or register bridge(s) and/or arbiter(s).
1.8. A target is connected from an initiator (1) or an arbiter (1).
1.9. A register bridge is connected from initiator(s) or arbiter(s).
1.10. An arbiter is connected from initiator(s) or arbiter(s).
1.11. An arbiter connects to arbiter(s) or target(s) or register bridge(s).
1.12. Only processor cores will be programmed with the addresses necessary to address a register bus.
1.13. There should only be one possible unique path from an mBus initiator interface to an mBus target interface.
1.14. Cores may have multiple mBus initiator interfaces (maximum number is a library property).
1.15. A memory interface core may have only one mBus target.
1.16. An mBus interface on a core that is unused will automatically have its unused input signals tied off.
1.17. An mBus may be split so that it goes to multiple blocks. The maximum number of destinations is a library property for cores and is configurable for arbitration blocks.

1.18. An arbitration block may have any number of input ports but may have only one output port.

Some of the aforementioned rules are formulated because the preferred embodiment of the invention is intended to be compatible with the architecture and system of posted read and write transactions which are the subjects of GB patent applications numbers 0113584 7 and 0113601 9 both filed on Jun. 5, 2001. Reference should be made to those applications for a more detailed explanation of the architecture (including aggregators and core wrappers) and the system of posted read and write transactions. For example, rule 1.3 above arises because the preferred embodiment described in the later of those two applications includes read and write transactions including an identification of the source of a write transaction or an initiator of a read transaction, the identifier being represented by a 6-bit binary field, sufficient to provide unique identification of up to 64 cores in the system. Other rules (as for the rules below) are appropriate to avoid ambiguity.

Register Diagram Rules

The register path will henceforth be referred to as the rBus.

The following are the rules for drawing register path diagrams as shown in FIG. 2.

2.1. One may add any core that has an rBus target interface.
2.2. One may add any number of cores.
2.3. A core may appear on one rBus only.
2.4. Cores that do not require to use rBus target functionality should be placed on a 'null register' bridge. This will ensure that unused input signals will be tied off.
2.5. Cores may have only one rBus target port.
2.6. A register bridge may have any number of rBus target ports.
2.7. A register bridge may have only one rBus initiator port.
2.8. All cores connected to a register bridge must have a clock frequency greater than or equal to the register bridge's clock frequency.

The following rules apply when adding clock generation functionality to the data diagrams.

C1. All blocks (cores, register bridges, arbiters) in the data diagram must be connected to a clock generator block.
C2. Blocks that run at the same clock frequency can be connected to a common clock generator block.
C3. A clock generator block derives its required clock frequency from the system clock unless specifically connected to another parent clock generator, in which case its clock frequency is derived from the parent block's clock frequency.
C4. A clock generator can be used as a parent if (a) none of the block's below it in the interconnect hierarchy talk directly to any other blocks at a higher level and if (b) all blocks below it in the interconnect hierarchy can have their clock frequency derived from it.

The rules for clock generators are, as indicated above, would generally apply but are also intended to render the specific clock system compatible with the system described in the aforementioned application No. 0104829 3.

Control Diagram Rules 3.1. All cores that have any non-data (mBus) or register (rBus) signals will appear in the control diagram. These signals will henceforth be referred to as controls signals and include such signals as interrupts and special purpose configuration signals.
3.2. One may connect input signals only to output signals.
3.3. One may connect signals of the same width only.
3.4. Unused signals will be automatically tied off.

Interconnect—Block Parameters

The following is a preferred list of the parameters that may be programmable for each of the interconnect logic blocks. Parameters can be added and removed from the tool as necessary. The parameters will have default values that will either be extracted from the associated core library properties or else inferred from a connection shown on one of the three diagrams (data, register or control).

The following abbreviations are used to specify parameter behaviour.

RW—The parameter can be read and written to by the tool.
RI—The value of the parameter is inferred from one of the interconnect diagrams. The value of the parameter can be read.
I—The value of the parameter is inferred from the one of the interconnect diagrams.
R—The value of the parameter can be read and its value is taken from the core library.

The parameters define what is configurable. They do not place any restrictions on how the parameterised Verilog is created.

Table 1 below shows examples of global system parameters by name, value, type and description. Table 2 and Table 3 similarly show the parameters for a clock generator block.

TABLE 1

| Parameter Name | Value | Type | Description |
| --- | --- | --- | --- |
| System_Clock | Integer | RW | This is the master clock that is sent around the chip to create lower frequencies clocks The System clock will have a default value of 200 |
| Max_Burst_Size | Integer | RW | The maximum burst size (read or write) which is allowed on the mBus The default maximum burst size will be 32 |

TABLE 2

| Parameter Name | Value | Type | Description |
| --- | --- | --- | --- |
| Block_Name | String | RW | All blocks in the diagram must have a unique name The block name will be used in the generation of Verilog signal names etc The default name will be 'Clk#' |
| Parent_Clock | Integer | RI | This will be either the system clock or the output from another clock generator block The Clock_Frequency used by connected blocks will be generated from it |
| Is_Logic_Block | Boolean | RW | If this parameter is true then a Logic_Clock will be generated and must be used by all connected blocks. The default value is False |
| Clock_Frequncy | Interger | RW | The clock frequency at which the logic of blocks connected to this Clock Generator will run at The System_Clock must be an integer multiple of this value |

The design tool will traverse the data diagram to create an array of divide by numbers for each lower frequency block connected to the set of blocks for which this clock generator is generating a clock frequency. The 'divide by' ratio array will be used in the generation of sample and strobe signals. The parameter is shown in Table 3.

TABLE 3

| Parameter Name | Value | Type | Description |
| --- | --- | --- | --- |
| Divide_By_Ratio [n] | Integer Array | I | The divide by ratio of each connected block of lower frequency The divide by ratio is calculated by dividing the Parent_Clock value by the Clock_Frequency of the lower frequency block |

Table 4 through to 7 illustrate the parameters for an arbitration block.

TABLE 4

| Parameter Name | Value | Type | Description |
| --- | --- | --- | --- |
| Block_Name | String | RW | All blocks in the diagram must have a unique name The block name will be used in the generation of Verilog signal names etc The default name will be 'Arb#' |
| Clock_Frequency | Integer | RI | The clock frequency at which the logic associated with this block will run at The System_Clock must be an integer multiple of this value |
| No_Of_Ports | Integer | I | This value is inferred from the data diagram Each arbitration block will initially have 2 input ports and one output port |
| SID_To_Port_No [n] | Integer Array | I | An entry in the hash table or array will exist for all cores below this arbitration block in the interconnect hierarchy Source Identifiers are used on the return path of the mBus to identify the Source of a read or write request |
| Required_ Bandwidth | Integer | RW | The bandwidth required by this arbitration block The default value for Required_Bandwidth is calculated by summing the allocated bandwidth at each of the arbitration block's input ports |

Each mBus input port in an arbitration block will have two types of buffers.

Up_Buffers store mBus read and write requests going up the interconnect hierarchy towards an mBus target. The size of some of the Up_Buffers is fixed (rdCmdData and rdCmdPhase) and the size of others is variable (wrInfo, wrPhase, wrData). The minimum size of the variable Up_Buffers is dependent on the system's Max_Burst_Size.

Down_Buffers store mBus read responses going down the interconnect hierarchy towards mBus initiators. The size of the Down_Buffers is variable (rdDataPhase, rdData, Hold_buffer). The minimum size of the variable Down_Buffers is dependent on the system's Max_Burst_Size.

The relevant parameters for an mBus input port are shown in Table 5 below.

TABLE 5

| Parameter Name | Value | Type | Description |
| --- | --- | --- | --- |
| Bandwidth_ Allocation | Integer | RW | The bandwidth to be allocated by the arbitration block to this mBus input port The default value will be inferred from the block connected below it in the interconnect hierarchy The default value will be the lesser of the following two values Required_Bandwidth or Output_Bandwidth An arbitration block will have a set number of slots Each Input port will be given a set number of slots based on its bandwidth allocation value |
| Priority | Enum | RW | The priority associated with this mBus input port It can be one of four possible values - Low Latency, High Priority, Low Priority or Normal Priority. |
| Min_Buffer_Size | Integer | RI | This is the minimum size of the buffers for this mBus input port The buffers cannot be decreased below this size The value is inferred from the diagram by multiplying the Max_ Burst_Size by the mBus_Width associated with this port |
| Up_Buffer_Size | Integer | RW | The integer number of storage locations in the Up_Buffers The size of each storage location is dependant on the specific buffer and the mBus_Width of the port It can never be less than Min_Buffer_Size, which is its default value |
| Up_Buffer_Assert | Integer | RW | How full the Up_Buffer needs to be before one can attempt to pass information up the interconnect hierarchy |
| Up_Buffer_Accept | Integer | RW | The number of storage locations that need to be available in the Up_Buffers before the will accept new information |
| Down_Buffer_Size | Integer | RW | The integer number of storage locations in the Down_Buffers The size of each storage location is dependant on the specific buffer and the mBus_Width of the port It can never be less than Min_ Buffer_Size which is its default value |
| Is_Throttled | Boolean | RW | This will stop requests being sent up from the corresponding Up Buffer if the Down Buffer is full It will default to False in most arbitration blocks It will default to True for arbitration blocks directly connected to mBus targets |

The parameters for mBus output ports are shown in Table 6 below.

TABLE 6

| Parameter Name | Value | Type | Description |
| --- | --- | --- | --- |
| Output_Bandwidth | Integer | RI | The bandwidth available at this mBus Output port The value is inferred from the diagram by multiplying the Clock_ Frequency of the arbitration block by the Bus_Width of this mBus |
| Bus_Width | Enum | RW | The width of this mBus The supported values are 8.16.32 and 64 The default value will be 32 |
| Duplex_Mode | Enum | RW | The duplex mode of the mBus The supported values are Half. Full The default value will be Half |

TABLE 6-continued

| Parameter Name | Value | Type | Description |
|---|---|---|---|
| Addressable_Targets [n] [3] | 2-Dim Integer Array | I | This array or hash table will define the upper 16 bits of the Base_Address of all mBus targets reachable through this output port All mBus target memories are contiguous so the base address of each target is sufficient to uniquely identify it It will store the input port of the higher level block through which the mBus target is accessible (mBus can be split to multiple destinations) |

The parameter for a rBus half-duplex target port is shown in Table 7 below.

TABLE 7

| Parameter Name | Value | Type | Description |
|---|---|---|---|
| Address_Bits_Decoded | Integer | RI | The number of address bits decoded defines the number of registers in this arbitration block The value is inferred from the diagram |

Is_Throttled will be turned on by default in any arbiter connected to an mBus target (memory or register bridge). It will be turned off by default in all other arbiters. Arbitration blocks directly connected to a memory interface preferably have a 64 bit wide output mBus.

The parameters for a register bridge (with in-built arbitrator) are shown in Tables 8 through to 10.

TABLE 8

| Parameter Name | Value | Type | Description |
|---|---|---|---|
| Block_Name | String | RW | All blocks in the diagram must have a unique name The block name will be used in the generation of Verilog signal names etc The default name will be 'Bridge#' |
| Clock_Frequency | Integer | RI | The clock frequency at which the logic associated with this block will run at The System_Clock must be an integer multiple of this value |
| No_Of_mBus_Ports | Integer | I | This value is inferred from the data diagram A register bridge will initially have 2 mBus target ports |
| Base_Address | Integer | RW | The base address of this mBus target |

The parameter for a rBus half-duplex initiator port is shown in Table 9.

TABLE 9

| Parameter Name | Value | Type | Description |
|---|---|---|---|
| Bus_Width | Enum | RW | The width of the rBus. The supported values are 8.16.32 and 64 The default value will be 32 The same rBus will be fed to all rBus targets connected to this register bridge |

For each of the rBus targets connected to this register bridge one will store the parameters shown in Table 10.

TABLE 10

| Parameter Name | Value | Type | Description |
|---|---|---|---|
| Start_Address_Offset | Integer | I | Used in the selection of an rBus target connected to this register bridge Each rBus target has a sequential range of valid addresses The start address of this range is calculated by adding the Start_Address_Offset to the Base_Address of the register bridge |
| End_Address_Offset | Integer | I | Used in the selection of an rBus target connected to this register bridge Each rBus target has a sequential range of valid addresses The end address of this range is calculated by adding the End_Address_Offset to the Base_Address of the register bridge |

The register bridge arbitration algorithm will preferably be fixed as round-robin. This means that it does not require any buffering and that there is no concept of bandwidth allocation on the rBus bus. The rBus will preferably always operate in half-duplex mode. The total bandwidth on the rBus is defined as (Register Bridge Clock_Frequency*Bus_Width).

The parameters for a core block are shown in Tables 11 through to 16.

TABLE 11

| Parameter Name | Value | Type | Description |
|---|---|---|---|
| Block_Name | String | RW | All blocks in the diagram must have a unique name The block name will be used in the generation of Verilog signal names etc The default name will be derived from the core's library property |
| Clock_Frequency | Integer | RI | The clock frequency at which the logic associated with the core wrapper will run at The System_Clock must be an integer multiple of this value |
| Source_Code_Directory | String | RW | Where the source code for this core is stored The default value will be taken from the core's library property |
| No_Of_mBus_Target_Ports | Integer | I | Number of mBus target ports supported The value cannot be greater than the library property but mBus ports can be left unused. |
| No_Of_mBus_Initiator_Ports | Integer | I | Number of mBus initiator ports supported The value cannot be greater than the library property but mBus ports can be left unused |
| mBus_Type | Enum | R | Denotes mBus target or an mBus Initiator Supported values are Target. Initiator The value is taken directly from the core's library property |

The parameters for an mBus initiator core are shown in Table 12.

TABLE 12

| Parameter Name | Value | Type | Description |
| --- | --- | --- | --- |
| Source_Identifier | Integer | RI | This will be a value in the range [0–63] Source Identifiers are used on the return path of the mBus to identify the Source of a read or write request mBus targets will not be allocated a Source Identifier |
| Is_Processor | Boolean | R | This value will be set to True if this core is a processor The value is taken directly from the core's library property. |

The parameters for a core wrapper's mBus initiator ports are shown in Table 13.

TABLE 13

| Parameter Name | Value | Type | Description |
| --- | --- | --- | --- |
| Bus_Width | Enum | RW | The width of this mBus The supported values are 8.16.32 and 64 The default value will be 32 |
| Duplex_Mode | Enum | RW | The duplex mode of the mBus The supported values are Half. Full The default value will be Half |
| Required_Bandwidth | Integer | RW | The bandwidth required by the Core on this mBus Output port The default value is taken directly from the core's library property |
| Output_Bandwidth | Integer | RI | The bandwidth available at this mBus Output port The value is inferred from the diagram by multiplying the Clock_Frequency for the Core by the Bus_Width of this mBus |
| Addressable_Targets [n] [3] | 2-Dim Integer Array | I | This array or hash table will define the upper 16 bits of the Base_Address of all mBus targets reachable through this port All mBus target memories are contiguous so the base address of each target is sufficient to uniquely identify it It will store the input port of the higher level block through which the mBus target is accessible (mBus can be split to multiple destinations) |

The parameters for an mBus target core are shown in Table 14.

TABLE 14

| Parameter Name | Value | Type | Description |
| --- | --- | --- | --- |
| Base_Address | Integer | RI | The base address of this mBus target Initiators will not have a Base_Address |
| Address_Offset | Integer | RW | The size of the addressable memory The default value is taken directly from the core's library property |
| Is_Memory_Interface | Boolean | R | This value will be set to True if this core is a memory interface The value is taken directly from the core's library property |

The parameters for a core wrapper's mBus target ports are shown in Table 15.

TABLE 15

| Parameter Name | Value | Type | Description |
| --- | --- | --- | --- |
| Bus_Width | Enum | RW | The width of this mBus The supported values are 8.16.32 and 64 The default value will be 64 |
| Duplex_Mode | Enum | RW | The duplex mode of the mBus The supported values are Half. Full The default value will be Half |
| Bandwidth_Allocation | Integer | RW | The bandwidth to be allocated by the mBus target to this mBus input port The default value is taken directly from the core's library property |
| Memory_Bandwidth | Integer | R | The bandwidth available to memory. The default value is taken directly from the core's library property |

The parameters for a core wrapper's rBus half-duplex target port is shown in Table 16.

TABLE 16

| Parameter Name | Value | Type | Description |
| --- | --- | --- | --- |
| Address_Bits_Decoded | Integer | RI | The number of address bits decoded defines the number of registers in this block The value is inferred from the diagram |

Signals

The Verilog source code for a core will be interrogated and at least the following values will be extracted for each signal.
(i) Signal Name
(ii) Signal Width
(iii) Signal Direction
(iv) Is it an External Signal (Pin out)
(v) Value to tie an Input signal to if it is unused
(vi) Signal Type mBus, rBus, other Connections/Bus Paths It is possible to specify a unique name for all the possible connection on the diagrams. Table 17 shows one such scheme.

TABLE 17

| Connection Type | Default Name |
| --- | --- |
| mBus | Block Name1_'Block Name2'_M |
| rBus | 'Register Bridge name'_R |
| Clock Line | 'Clock Frequency'_Clk |
| Parent Clock Line | 'Clock Frequency'_PClk |

Reusable Core Library Properties

Table 18 illustrates the type of properties that will be stored for each core in the library.

TABLE 18

Core Name
Range of clock frequencies supported - (used to decide if logic clock needed)
Is this an mBus Initiator, an mBus target or both
Number of mBus target ports
Number of mBus initiator ports
Is it a processor?
Is it a memory interface?
Is full source code available?
Source code storage area
Description of core functionality

TABLE 18-continued

Estimated gate count
Process geometry supported
Estimated power consumption
Core internal frequency Table 19 illustrates the type of properties preferably defined for each mBus initiator port on the core.

TABLE 19

Bus widths supported
Duplex modes supported
Required bandwidth
Maximum number of selectable mBus destinations Table 20 illustrates the type of properties preferably defined for each mBus target port on the core.

TABLE 20

Bus widths supported
Duplex modes Supported

Table 21 illustrates the type of properties preferably defined for each mBus target.

TABLE 21

Overall bandwidth to memory
Size of the addressable memory

Table 22 illustrates the type of properties preferably defined for each rBus half-duplex target.

TABLE 22

Number of bits decoded which defines the number of registers in the core

A memory map assumes a fixed address size of 32 bits but can easily be modified to support a 64-bit address size. The memory map will allow one to specify the base address of each block with one or more mBus target ports. The mBus targets would be extracted from the data diagram. An mBus target can be memory, a register bridge or a mailbox memory. All base addresses should be aligned at a 64K boundary.

Ordinary Memory Address Pool Size

The size of the address pool assigned to normal memory should be configurable. The size of the memory address pool can be incremented in 64K increments.

Register Bridge Address Pool Size

Register bridges have a minimum address pool size. The allocated pool is configurable above the minimum size. It will be possible to calculate this minimum size from the register path diagram (i.e. number of rBus targets connected to the register bridge).

The register address pool size assigned to each rBus target on a specific rBus is constrained by the rBus target with the greatest number of registers on that bus. The size of the register address pool assigned is:

The smallest n such that $(2^n <= m)$ where m is the number of registers in the rBus target which has the largest number of registers on this rBus.

Thus the majority of the rBus targets will be over allocated. The rBus targets will only look at the bits necessary to uniquely select one of its internal registers. E.g. n=6 or each core is allocated an address pool of 127 addresses. If a core has only three registers it will only look at the two lowest order bits.

The address bus width on the rBus can be up to 32 bits wide. In practice however the register bridge will only feed out the number of address bits necessary to uniquely select a core attached to its rBus.

The pool of memory addresses assigned to a register bridge will always be an integer multiple of 64K. Then the size of the memory pool assigned to the register bridge will be at least $Z=(\Sigma 2^n)+G$ where $((\Sigma 2^n)+G) \% 65535=0$ and there will be G unused addresses.

Calculating the Number of Registers in a Block

The number of registers in a core is taken directly from the core's library property. The number of registers in an arbitration block can be calculated using the formula (or something similar to this) x+p(q) where x is the number of internal registers, p is the number of input ports and q is the number of registers at each input port.

Note: All memory must be aligned on 64K boundaries because the arbitration blocks only look at the top 16 bits of an address in order to decide on which path an mBus target is located.

Generation of Interconnect Logic

Figure 4:
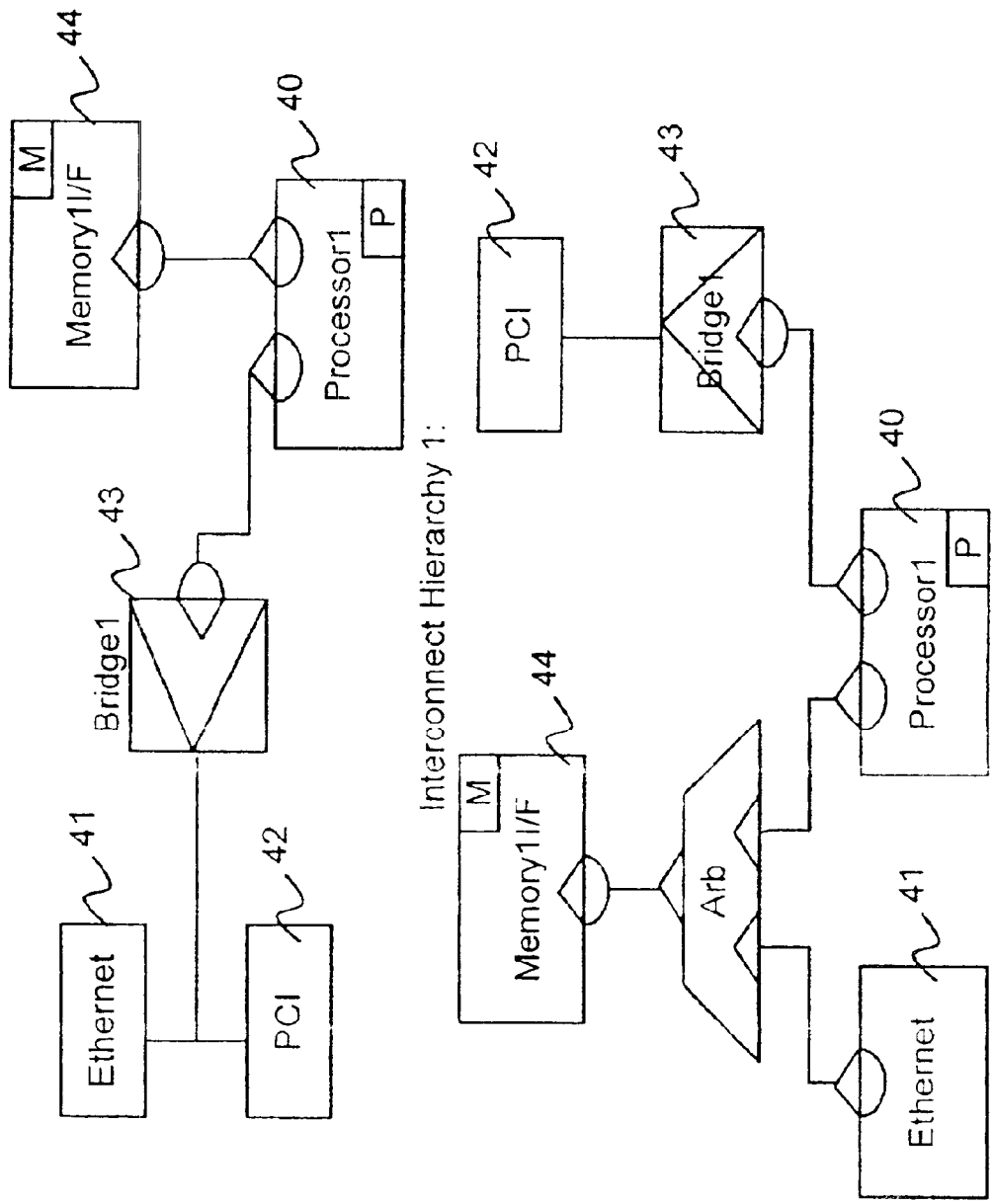
FIG. 4 is a diagram illustrating interconnection hierarchies

FIG. 4 shows two interconnect hierarchies and so how the same set of cores selected from a library of reusable cores can be connected in radically different ways. Product teams decide on the functional logic required in a new ASIC (i.e. which cores need to be selected from the library).

More particularly FIG. 4 illustrates the two different interconnect hierarchies which can be constructed using the same set of re-usable 'cores' obtained from the library. In each case the selection of cores from the library is a processor core 40, an Ethernet core 41, a PCI core 42 and a memory interface 44.

In the first interconnect hierarchy shown in FIG. 4, the idea is that the processor 40 should be able to initiate read or write transactions on a memory bus to the memory interface and should be able to initiate register transactions by way of the bridge 43 to the Ethernet core 41 and the PCI core 42.

Figure 6:
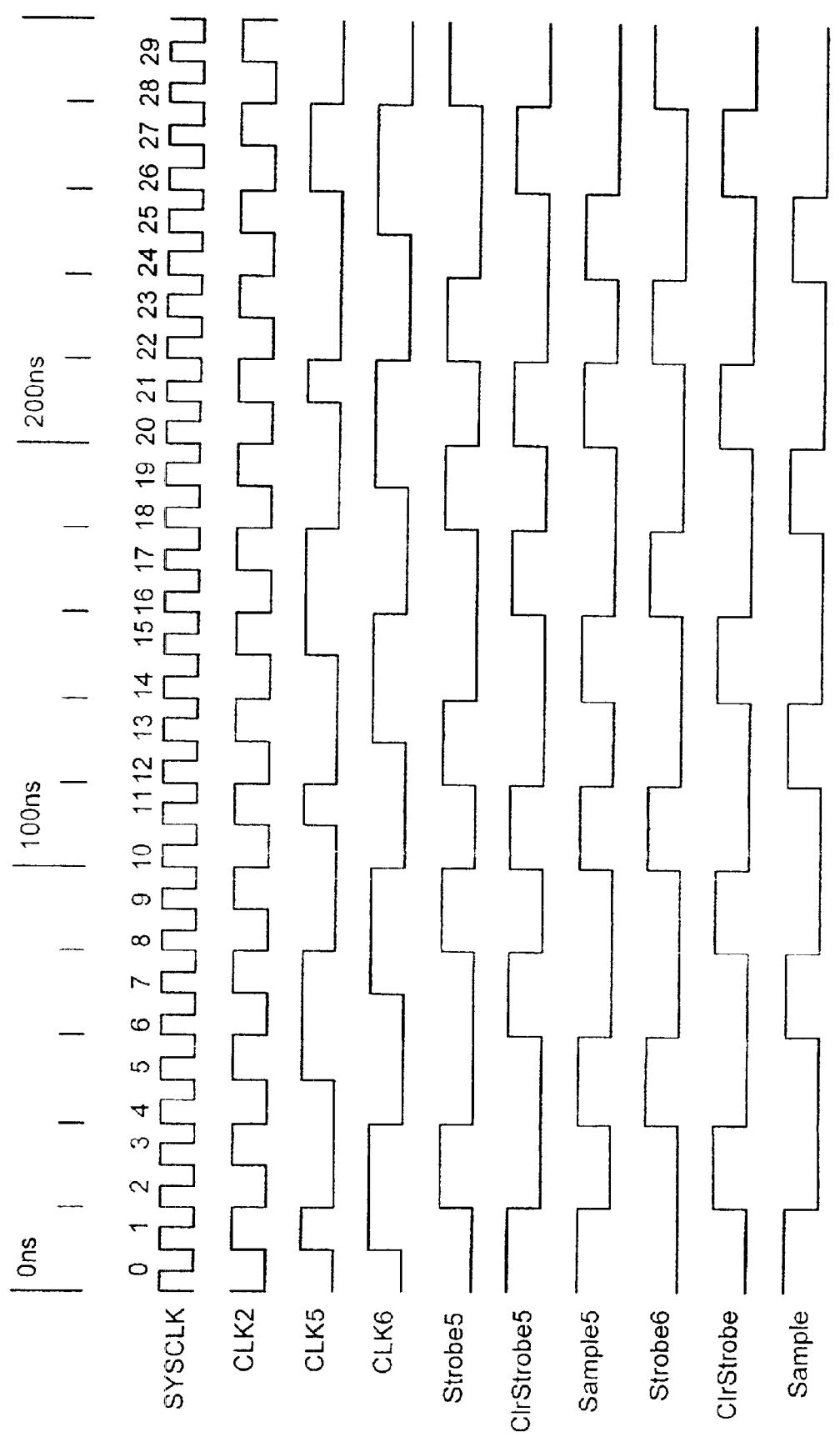
FIG. 6 is a timing diagram for the state machine shown in FIG. 5

In the second interconnect hierarchy shown in FIG. 6, the processor 40 and the Ethernet core 41 can initiate data transactions on a memory bus to the memory interface 44 and the processor can initiate register transactions for the PCI core 42 by way of bridge 43.

Example of Pseudo-Code

The following pseudo-code describes the top-level steps used to automatically generate the interconnect logic. New interconnect block types may be added to the interconnect in the future. The top-level design will allow new elements to be added easily. Functionality may be added to or removed from the interconnect blocks in the future.

CLK_BLK[ ]=array of clock generator objects of size NO_CLK_BLK

REG_BLK[ ]=array of register bridge objects of size NO_REG_BLK

ARB_BLK[ ]=array of arbitration objects of size NO_ARB_BLK

IPWRAPPER[ ]=array of core wrapper objects of size NO_IPWRAPPER_BLK

VALID=Boolean value used to decide if the interconnect hierarchy is valid.

VALID=Validate Interconnect Hierarchy( )
If (Valid==0)
    Exit

For ((n=0)->(n=NO_CLK_BLK-1)
   Create Clock Logic (CLK_BLK[n])
   Add to Instantiation File (CLK_BLK[n])
For (n=0)->(n=NO_REG_BLK-1)
   Create Bridge Logic (REG_BLK[n])
   Add to Instantiation File (REG_BLK[n])
For (n=0)->(n=NO_ARB_BLK-1)
   Create Arbitration Logic (ARB_BLK[n])
   Add to Instantiation File (ARB_BLK[n])
For (n=0)->(n=NO_IPWRAPPER_BLK-1)
   Create IP Wrapper Logic (IPWRAPPER[N])
   Add to Instantiation File (IPWRAPPER[N])

Validation of Interconnect Hierarchy

The interconnect hierarchy is validated before any Verilog is generated. The tool checks if any architectural assumptions, interconnection rules or clock generation rules are broken. The tool will automatically enforce certain rules as a designer inputs information (i.e. parameter value ranges, connections between blocks). The following is a list of the checks that can only be performed once the diagrams are complete and the user wishes to generate Verilog.

1. Each rBus path has at least one rBus target interface connected to it or stated another way each register bridge has at least one core connected to it in the register diagram.
2. There are no more than the specified maximum number of cores.
3. Only processor cores are programmed with register bridge addresses.
4. There is only one unique path from an mBus initiator to an mBus target or stated another way there are no loops in the diagram. All paths start with an initiator and end with a target.
5. All blocks in the diagram are connected to a clock generation block.
6. If a clock generator is used as a parent then the following two conditions must hold (a) none of the blocks below it in the interconnect hierarchy talk directly to any other blocks at a higher level and if, (b) all blocks below it in the interconnect hierarchy can have their Clock_Frequency derived from it.
7. The memory map has been correctly defined, there are no overlapping areas and that any reserved addresses have not been assigned (E.g. initial boot address of a boot processor).

The validation stage will also generate warnings. It would be possible to change the severity of a warning so that it could stop the generation of Verilog. The following is a non-exhaustive list of these warnings.

1. Any parameter is still set to a default value.
2. Unused interfaces/signals exist within a wrapper (mBus, rBus or control signals).
3. The required bandwidth for an arbitration block is greater than its output bandwidth (freq*bus width).
4. The required bandwidth is greater than the output bandwidth on any mBus initiator port.
5. The sum of the bandwidths allocated is greater than the memory bandwidth of an mBus target.

Creation of Clock Logic

The following pseudo-code describes the high level steps used to create the logic for a clock generator block. The parameters used in the creation of clock logic are fully described previously.

NAME=Unique name for this Clock Generator Block
   CLK_FREQ=Clock frequency generated by block
   PARENT_CLK=Parent clock used to derive the generated Clock frequency
   IS_LOGIC_CLK=Boolean value which specifies if a Logic Clock should be generated or not
   CLK_SIGNALS[ ]=array of objects from the blocks connected to the Clock Generator of size. CONNECTIONS Holds information such as divide by ratios etc.
Clock Edge Identification (CLK_RATIOS[ ])
For (n=0)->(n=CONNECTIONS-1)
   Choose CLK divide Function (CLK_RATIO[n], IS_LOGIC_CLK
Create the Clock State Machine ###
For (n=0)->(n=CONNECTIONS-1)
   Clk Generation Algorithm (CLK_SIGNALS[n])
   Strobe Signal Algorithm (CLK_SIGNALS[n])
   Sample Signals Algorithm (CLK_SIGNALS[n])
   Create Clock Out Interface (n)
'Divide-By' Clocks Algorithms for generation of any 'divide-by' clock to be used in the architecture and algorithms for the generation of strobe, ClrStrobe and sample signals may be as follows.

Algorithm for Clock Edge Identification
A, B=divide-by numbers
if (a % 2==0)| |(B % 2==0)
   NO_OF_STATES=Lowest Common Multiple (LCM) of A & B
else
   NO_OF_STATES=LCM of (A & B)*2
NO_OF_EDGES=(NO_OF_STATES)/A
POS_EDGE=array of size NO_OF_EDGES
NEG_EDGE=array of size NO_OF_EDGES
Choose Clock Divide Functions (Clock Type A)
Chooses which CLK equation CLK_TYPE_A belongs to based on whether A & A/2 are
even numbers. Also chooses logic CLK if LOGIC flag is high.

```
if A%2 = 0 {
    if A/2%2 = 0 [A is an even number]
        CLK_TYPE_A = EVEN_EVEN   [A is an even number]
    else
        CLK_TYPE_A = EVEN_ODD   [A is an odd number]}
else {    [A is an odd number]
    if (A-1)/2%2 = 0 {
        [The number below A = EVEN-EVEN CLK]
        CLK_TYPE_A = ODD_EVEN
        if LOGICA [If Logic flag is high]
            [Logic CLK of type ODD_EVEN_L]
            CLK_TYPE_AL = ODD_EVEN_L
        else
            CLK_TYPE_AL = NULL
    } else {
        [The number below A = EVEN-ODD CLK]
        CLK_TYPE_A = ODD_ODD
        if LOGICA
            [Logic CLK of type ODD_ODD_L]
            CLK_TYPE_AL = ODD_ODD_L
        else
            CLK_TYPE_AL = NULL   [Do not create Logic CLK]
    }
}
```

EVEN to EVEN CLKS
Creates two arrays detailing the SYSCLK edges which have POSEEDGEs/NEGEDGEs

```
for (n=0) -> (n = NO_OF_EDGES - 1)
    POSEDGE[n] = n A + 1
for (n=1) -> (n = NO_OF_EDGES)
    NEGEDGE[n-1] = A (2n-1)/2
EVEN to ODD
for (n=0) -> (n = NO_OF_EDGES - 1)
    POSEDGE[n] = n A + 1
for (n=1) -> (n = NO_OF_EDGES)
    NEGEDGE[n-1] = A (n+1)/2
ODD to EVEN
for (n=0) -> (n = NO_OF_EDGES - 1) {
    if (n%2 = 0)
        POSEDGE[n] = A n + 1
    else
        POSEDGE[n-1] = A n
}
for (n=1) -> (n = NO_OF_EDGES - 1) {
    if (n%2 = 0)
        NEGEDGE[n-1] = [A (2n-1) + 1]/2
    else
        NEGEDGE[n-1] = [A (2n-1) - 1]/2
}
ODD to ODD
for (n=0) -> (n = NO_OF_EDGES - 1) {
    if (n%2 = 0)
        POSEDGE[n] = A n + 1
    else
        POSEDGE[n-1] = A n
}
for (n=1) -> (n = NO_OF_EDGES - 1) {
    if (n%2 = 0)
        NEGEDGE[n-1] = [A (2n-1) - 1]/2
    else
        NEGEDGE[n-1] = [A (2n-1) + 1]/2
}
ODD to ODD Logic Clock
for (n=0) -> (n = NO_OF_EDGES - 1)
    POSEDGE[n] = A n + 1
for (n=1) -> (n = NO_OF_EDGES){
    if (n%2 = 0)
        NEGEDGE[n-1] = [A (2n - 1) + 1] /2
    else
        NEGEDGE[n-1] = [A (2n - 1) + 3] /2
}
ODD to EVEN Logic Clock
for(n=0) -> (n = NO_OF_EDGES - 1)
    POSEDGE[n] = A n + 1
for (n=1) -> (n = NO_OF_EDGES) {
    if (n%2 = 0)
        NEGEDGE[n-1] = [A (2n - 1) + 3] /2
    else
        NEGEDGE[n-1] = [A (2n - 1) + 1] /2
}
```

Algorithm for CLK Generation

Generates the CLK pulses based on the numbers associated with the POSEDGE and NEGEDGE arrays. For hand-designed state machines, there is sufficient information in the above blocks to generate the state table outputs for these clocks.

```
CLKA[0] = 0
PREV_CLK = 0
for (y = 0) -> (y = NO_OF_EDGES - 1) {
    for (n = 1) -> (n = NO_OF_STATES) {
        if (POSEDGE[y] == n)
            CLKA[n] = 1
        else if (NEGEDGE[y] == n)
            CLKA[n] = 0
```

-continued

```
        else {
            CLKA[n] = PREV_CLK
            PREV_CLK = CLKA[n]
        }
    }
}
```

Algorithm for Generation of Strobe Signals

Strobe Signal

Generates the strobe signal based on the rule $1^{st}$ (fast) POSEDGE after (slow) NEGEDGE.

```
PREV_STROBE = 0    value of Strobe signal in previous state
PREV_A = 0         value of CLKA in previous state
PREV_B = 0         value of CLKB in previous state
for (n = 0) -> (n = NO_OF_STATES - 1) {
    CURR_A = CLKA[n]  assigns CURR_A the current value of CLKA
    CURR_B = CLKB[n]  //assigns CURR_B the current value of CLKB
    if (PREV_A == 0) && (CURR_A == 1) && (PREV_STROBE == 1)
        STROBED = 1       data strobed on this edge
    if (PREV_B == 1) && (CURR_B == 0)
        STROBE[n] = 1     sets Strobe on NEGEDGE of CLKB
    else if (PREV_A == 1) && (CURR_A == 0) && (STROBED)
        STROBE[n] = 0     Clears Strobe on NEGEDGE of CLKA
    else
        STROBE[n] = PREV_STROBE //set Strobe to prev value
    PREV_A = CLKA[n]      sets PREV_A to current CLKA value
    PREV_B = CLKB[n]      sets PREV_B to current CLKB value
    PREV_STROBE = STROBE[n] sets PREV_STROBE to current
                            STROBE value
```

Strobe Signal (Fast Logic CLK)

Generates the strobe signal when the faster block has a logic CLK. Variation on the rule for i/f->i/f CLKs.

POSEDGE (fast Logic CLK) before $1^{st}$ NEGEDGE (fast Logic CLK) after NEGEDGE (slow I/f CLK).

```
PREV_STROBE = 0    value of STROBE in previous state
PREV_AL = 0        value of CLKAL in previous state
PREV_B = 0         value of CLKB in previous state
B_NEG = 0          stores a value related to a CLKB NEGEDG
NEXT_EDGE_AL = 0   flag that controls the strobing edge of
for (n = 0) -> (n = NO_OF_STATES-1) {
    STROBE[n] = 0     set all n STROBEs to 0(unless overwritten)
    CURR_AL = CLKAL[n]    current value of AL
    CURR_B = CLKB[n]      current value of B
    if (PREV_AL = 0) && (CURR_AL = 1)
        POS_VALID_AL = n   set POS_VALID_AL on CLKAL
                           POSEDGE
    else if (PREV_AL = 1) && (CURR_AL = 0)
        POS_VALID_AL = 0 reset POS_VALID_AL on CLKAL NEGEDGE
    if (PREV_B = 1) && (CURR_B = 0) {
        if (POS_VALID_AL 1= 0) {
            B NEGEDGE - POS_VALID_A not zero
               overwrite the values for Strobe at the two indexes
               given here, and set B_NEG to n.
            STROBE[POS_VALID_AL-1] = 1
            STROBE[POS_VALID_AL] = 1
            B_NEG = n
        } else if (POS_VALID_AL = 0) {
            STROBE[n] = 1       if POS_VALID_AL has been set to 0
            NEXT_EDGE_AL = 1    set NEXT_EDGE_AL and B_NEG
            B_NEG = n
    }
}
```

-continued

```
if (PREV_AL = 0) && (CURR_AL = 1) && (NEXT_EDGE_A = 1) {
    if POSEDGE CLKAL and NEXT_EDGE is 1
    / keep STROBE high from the value of B_NEG to
    for (i = B_NEG) -> (i = n)
        STROBE[i] = 1    the current state
    NEXT_EDGE_AL = 0    reset all flags
    POS_VALID_AL = 0
    B_NEG = 0
}
PREV_AL = CLKAL[n] set previous CLKs to current CLKs
    PREV_B = CLKB[n
}
```

Algorithm for Generation of ClrStrobe Signal

Generates the ClrStrobe signal. This signal is asserted two CLK ticks before a slow CLK NEGEDGE, and de-asserted on the NEGEDGE itself. ClrStrobe is used to override the Lstrobe internal signal preventing a node from Strobing data a clock tick before the NEGEDGE of the slower block with which it is communicating.

```
PREV_CLK_B = 0
CURR_CLK_B = 0
for(n = 0) -> (n = NO_OF_STATES - 1) {
    CLKA[n] = 0
    if (PREV_CLK_B == 1) && (CURR_CLK_B == 0) {
        CLKA[n-2] = 1
        CLKA[n-1] = 1
    }
    PREV_CLK_B = CURR_CLK_B
}
```

Algorithm for Generation of Sample Signal

This algorithm produces the sample signal based on the rule:

(fast) POSEDGE before $1^{st}$ (fast) NEGEDGE after (slow) POSEDGE

```
PREV_A = 0          value of CLKA in previous state
PREV_B = 0          value of CLKB in previous state
NEXT_EDGE_A = 0     identifies correct sampling edge
for (n = 0) -> (n = NO_OF_STATES-1) {
    SAMPLE[n] = 0   sample signal set low in every state
    CURR_A = CLKA[n] assigns CURR_A the current value of CLKA
    CURR_B = CLKB[n] assigns CURR_B the current value of CLKB
    if (PREV_A = 0) && (CURR_A = 1)
        POS_VALID_A = n  state which a valid posedge of A occurs
    if (PREV_B = 0) && (CURR_B = 1) {
        if (POS_VALID_A = 1)
            overwrites previously stored values of sample
            based on POS VALID signal
            SAMPLE [POS_VALID_A - 1] = 1
            SAMPLE [POS_VALID_A] = 1
            POS_VALID_A = 0
        } else if (POS_VALID_A = 0) {
            NEXT_EDGE_A = 1 sample data on next POSEDGE of A
        }
    if (PREV_A = 0) && (CURR_A = 1) && (NEXT_EDGE_A = 1) {
        SAMPLE[n-1] = 1   sample signal high for 2 ticks
        SAMPLE[n] = 1     if NEXT_EDGE flag is set
        NEXT_EDGE_A = 0
    }
    PREV_A = CLKA[n]   sets PREV_A to current CLKA value
    PREV_B = CLKB[n]   sets PREV_B to current CLKB value
}
```

Sample Signal (Slow Logic CLK)

This generates the sample signal when the slower block has a logic CLK. Variation on the rule for i/f->i/f CLKs.

POSEDGE (fast CLK) before $1^{st}$ NEGEDGE (fast CLK) after NEGEDGE (slow Logic CLK).

SAMPLE is set low on every n, and may be overwritten by the process described here. Checks for POSEDGE of fast CLK. Stores VALID, and the SYSCLK number associated with it. Clears VALID on a NEGEDGE. Checks for slow Logic NEGEDGE. If VALID is high, then SAMPLE pulses high prior to the SYSCLK associated with VALID. If VALID is low then a NEXT_EDGE signal is set high, causing SAMPLE to pulse prior to the next fast POSEDGE.

```
PREV_SAMPLE = 0      sets variables to 0
PREV_A = 0
PREV_BL = 0
NEXT_EDGE_A = 0
for (n = 0) -> (n = NO_OF_STATES-1) {
    SAMPLE[n] = 0 //initialise sample signal array to zero
    CURR_A = CLKA[n]
    CURR_BL = CLKBL[n]
    if (PREV_A = 0) && (CURR_A = 1) store POSEDGE value of CLKA
        POS_VALID_A = n
    else if (PREV_A = 1) && (CURR_A = 0) reset if NEGEDGE of
        CLKA POS_VALID_A = 0
    if (PREV_BL = 1) && (CURR_BL = 0) { if NEGEDGE of CLKBL
        if (POS_VALID_A 1 = 0) {
            if POS_VALID_A is set overwrite the
            value of SAMPLE at the two indexes given
            SAMPLE [POS_VALID_A - 1] = 1   & reset POS_VALID_A
            SAMPLE [POS_VALID_A] = 0
            POS_VALID_A = 0
        } else if (POS_VALID_A = 0) {
            if POS_VALID_A is not set then set NEXT_EDGE
            NEXT_EDGE_A = 1
        }
    }
    if (PREV_A = 0) && (CURR_A = 1) && (NEXT_EDGE_A = 1) {
        SAMPLE[n-1] = 1 if POSEDGE A and NEXT_EDGE_A is set
        SAMPLE[n] = 1 previous current SAMPLE to 1
        NEXT_EDGE_A = 0 //to 1 Reset the NEXT_EDGE variable
    }
    PREV_A = CURR_A[n] set the PREV variables to CURRENT values
    PREV_BL = CURR_BL[n]
}
```

Example Divide-By-2, Divide-By-5 and Divide-By-6

This example shows the necessary states and signals for a Divide-by-2 block communicating with Divide-by-5 and Divide-by-6 blocks. This state machine will require 30 states (LCM of 3 numbers).

Figure 5:
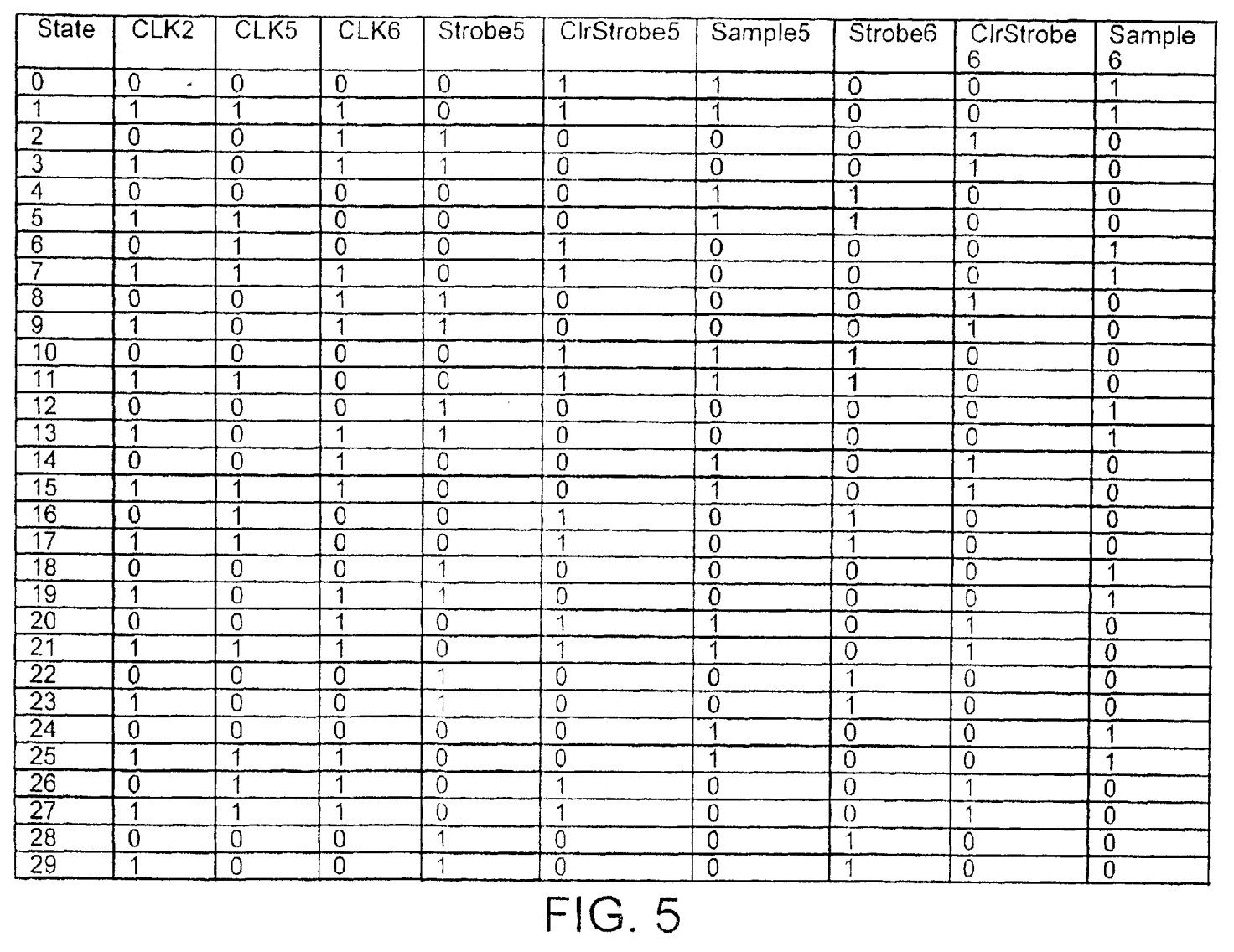

FIGS. 5 and 6 illustrate the progression of states and the timing diagram for the corresponding state machine.

High Level Clock Functions

Figure 7:
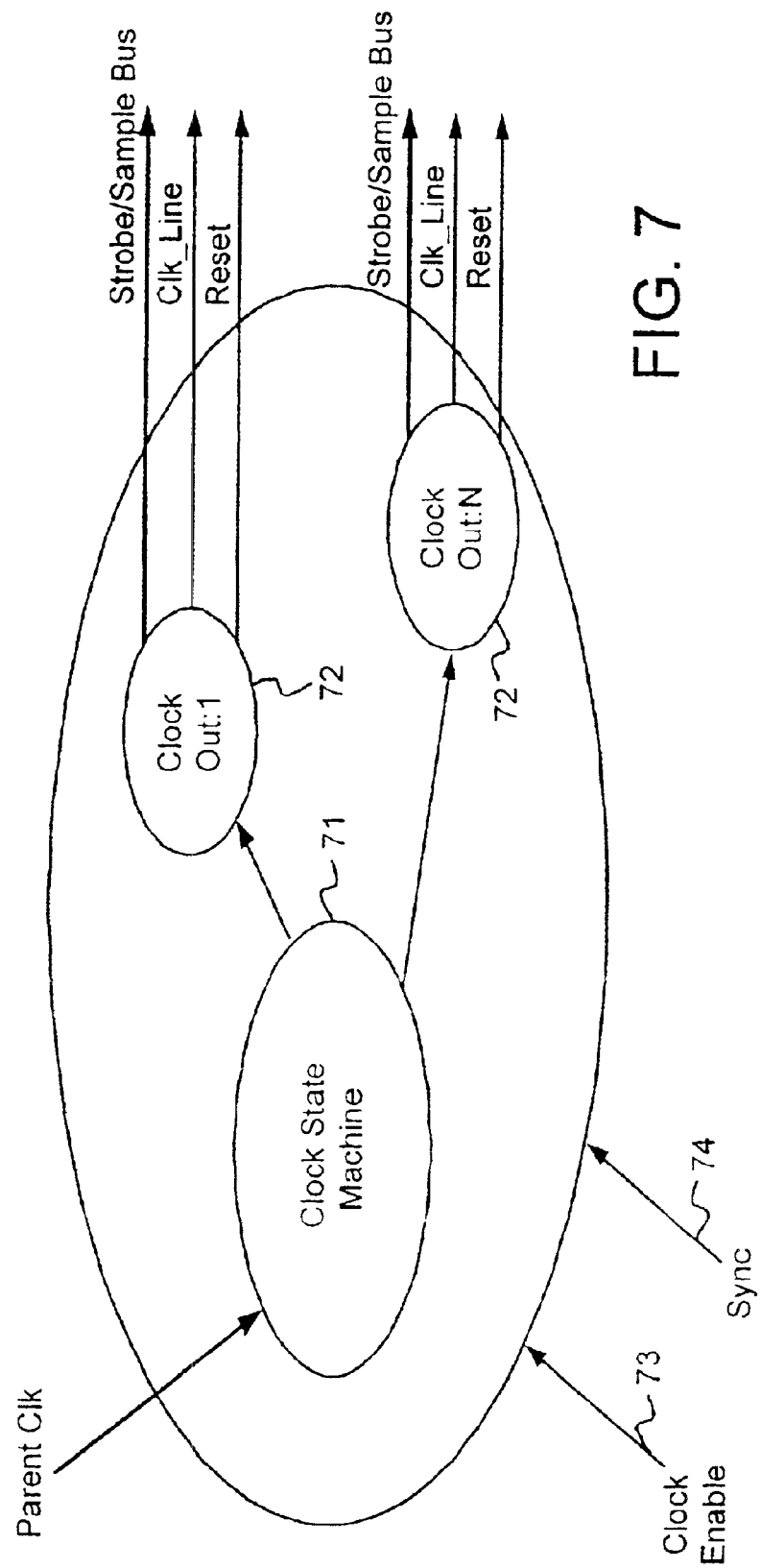
FIG. 7 is a diagram illustrating high level clock functions

Typical high level clock functions are shown in FIG. 7, which illustrates a clock generation block 70. Reference 71 denotes a 'clock state machine'. All the Verilog associated with this function can be generated by the algorithms described previously. The parameters that are used as input to this algorithm are configurable parameters and diagramming rules. The size and complexity of the state machine is dependent on the three parameters described namely— Parent Clock, Is_Logic_Block and Divide_By_Ratio. The clock state machine takes in a synchronisation signal 73 that ensures that the generated clock is always in sync with the system clock. A clock enable signal 74 will turn off the clock generator and hence power down all blocks connected to this generator.

References 72 each denote a 'clock out interface'. There will be one interface per group of interconnect blocks (i.e. arbiter, wrapper, bridge) to which the clock generation block is connected. This interface will drive the necessary clock signals (clock, sample, strobe etc.) and reset signals to the connected block. The Verilog for this function can be created from a standard template that will be instantiated within the block the required number of times. The signal names for each interface should be changed to ensure that they are unique. The width of the output clock bus within this template code will be configurable and will depend on the number of sample and strobe signals that need to be driven into the connected block.

Creation of Bridge Logic

The following pseudo-code describes the high level steps used to create the logic for a register bridge. The parameters used in the creation of logic for a register bridge are fully described previously.

```
NAME = Unique name for this register bridge
CLK_SIGNALS = Reference to an object which describes the
   clock signals for this Block BASE_ADDR = The base address for
   the block
MBUS_PORTS [ ] = array of connected mBus port objects of size
   NO_MBUS_PORTS
RBUS_WIDTH = the width of the rBus
RBUS_TARGETS[ ] = array of connected rBus target objects of size
   NO_RBUS_TARGETS
Create Clock Interface (CLK_SIGNALS)
For (n=0) -> (n = NO_MBUS_PORTS-1)
   mBus target Logic (MBUS_PORTS [n] )
Round Robin Arbiter ( NO_MBUS_PORTS)
mBus to rBus state machine ( )
rBus initiator port ( )
Clock Interface( )
For (n=0) -> (n = NO_RBUS_TARGETS-1)
   rBus Select Logic ( RBUS_TARGETS[n] )
```

Figure 8:
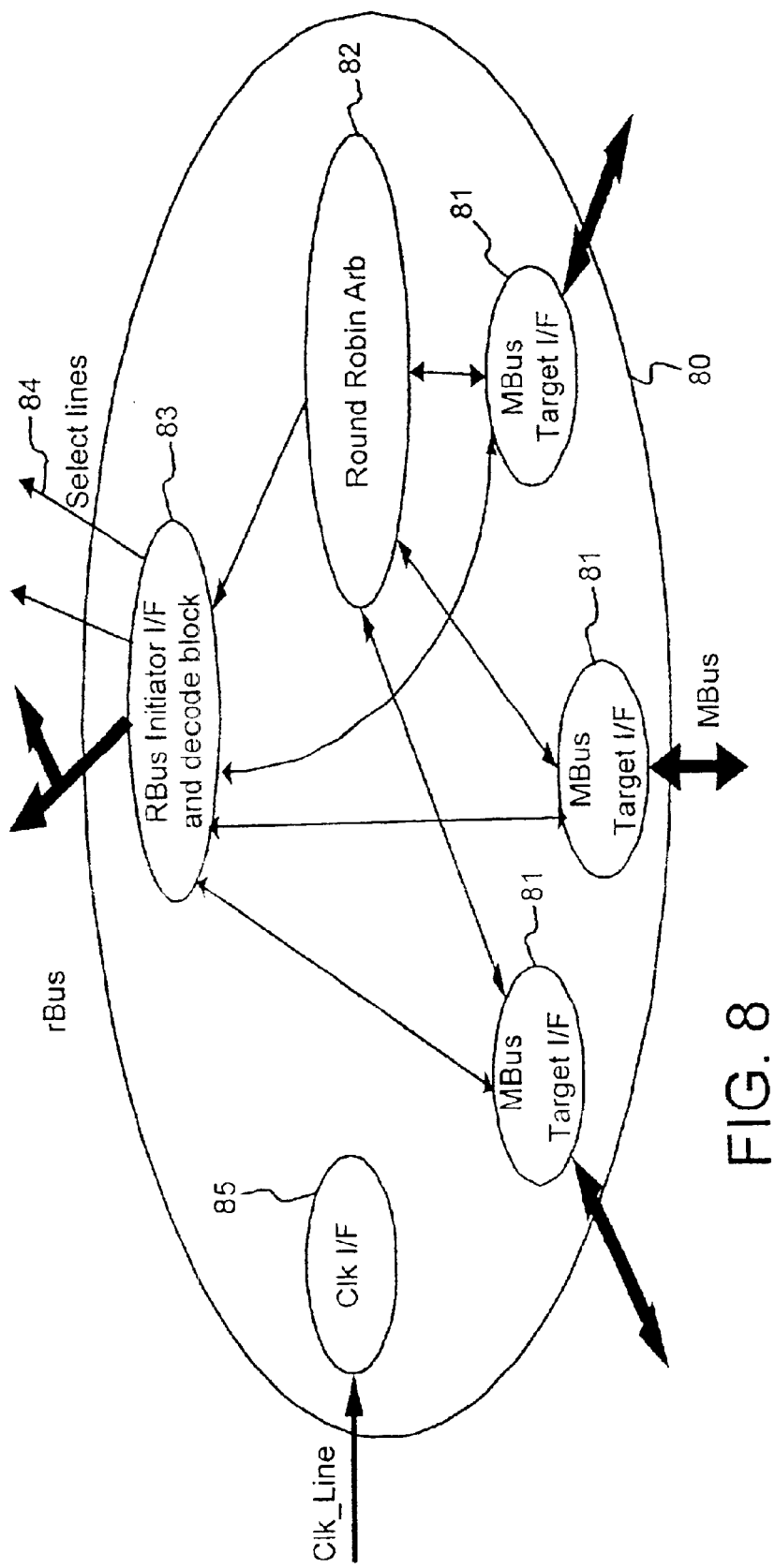
FIG. 8 is a diagram illustrating bridge functions

The high level register bridge functions are shown in FIG. 8, which illustrates a register bridge 80.

The reference 81 denotes an mBus target interface. The Verilog for this function can be created from a standard template that will be instantiated within the block the required number of times. The signal names for each interface should be changed to ensure that they are unique. The mBus target interface accepts an mBus read and write request. It stalls the interface until the request is handled (read response or write acknowledgement). It waits for an access grant from the arbiter and passes the request to an rBus initiator interface 83 and handles the response.

Reference 82 denotes a round-robin arbiter. The Verilog for this function can be created from a standard template. The template will be configured with a parameter defining the number of mBus target interfaces that must be arbitrated. The round-robin arbiter polls each mBus target interface for rBus read or write requests in a cyclic manner each time the rBus is idle. It grants access to the rBus for the first request it finds at any mBus target interface.

Reference 83 denotes an rBus initiator interface and decode. The Verilog for this function can be created from a standard template. The signal names will be changed to ensure that they are unique for each register bridge created. The rBus initiator interface translates the mBus to rBus requests and visa versa in the opposite direction. The function will be parameterised with the range of addresses that it recognises. The rBus initiator interface looks at each address offset passed to it and decides which select line should be driven high.

Reference 84 denotes select lines. The top level register bridge block is parameterised to define the number of select lines supported. The value of the parameter is equal to the number of rBus targets connected to the rBus.

Reference 85 denotes a clock interface. The Verilog for this function can be created from a standard template. The block's external signal names would be changed to ensure that they are unique. A similar template will be used in all the interconnect blocks (i.e. arb, wrapper, bridge). The clock interface distributes the clock signal to all functions within the block. It will route sample and strobe signals to the mBus and rBus interfaces defined for this interconnect block and handle a reset signal.

Creation of Arbitration Logic

The following pseudo-code describes the high level steps used to create the logic for the arbitration block. The parameters used in the creation of logic for an arbiter are fully described previously.

```
NAME = Unique name for this arbitration block
CLK_SIGNALS = Reference to an object which describes the clock
   signals for this block
MBUS_IN_PORTS [ ] = array of connected mBus port objects
   and input port parameters of size NO_MBUS_PORTS
MBUS_OUT_PORT = mBus objects which describes the mBus
   output port parameters
MBUS_TARGETS = number of mBus targets
Create Upward Path Logic ###
Create Clock Interface (CLK_SIGNALS)
rBus target port ( )
For (n=0) -> (n = NO_MBUS_PORTS-1)
   mBus Input Logic (MBUS_IN_PORTS [n] )
   create FIFO logic (MBUS_IN_PORTS [n])
Create Arbiter (NO_MBUS_PORTS. MBUS_IN_PORTS[ ])
mBus output port (MBUS_OUT_PORT . NO_MBUS_PORTS)
For (n=0) -> (n = MBUS_TARGETS-1)
   mBus Select Logic ( MBUS_TARGETS)
Create Downward Path Logic ###
For (n=0) -> (n = MBUS_TARGETS-1)
   mBus Input Logic ( )
   create Hold FIFO and Decode Logic ( )
For (n=0) -> (n = NO_MBUS_PORTS-1
   create ReadBack and Ack FIFO (MBUS_IN_PORTS [n] )
   mBus output port (MBUS_TARGETS)
```

Figure 9:
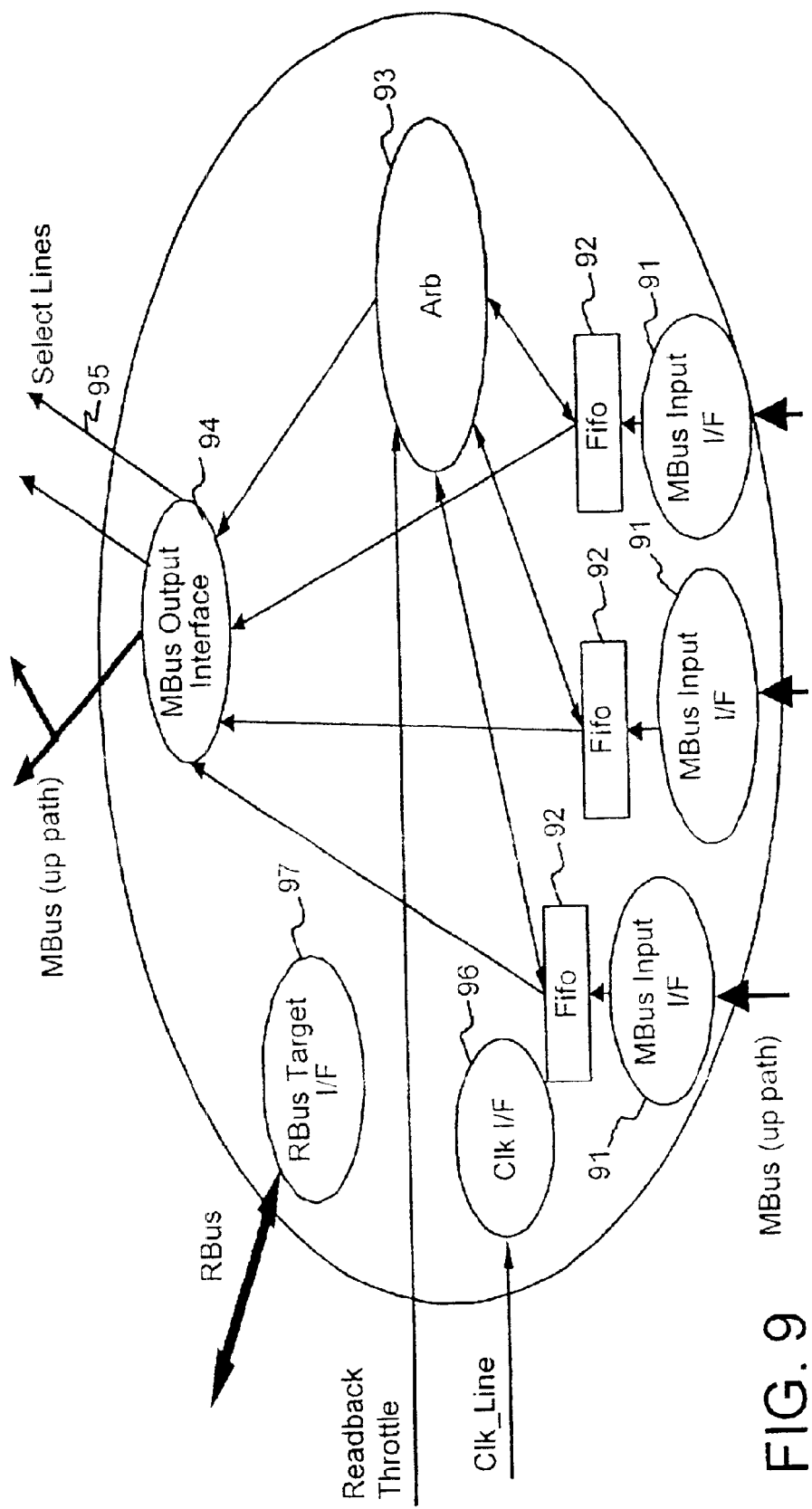
FIG. 9 is a diagram illustrating arbitration functions
Figure 10:
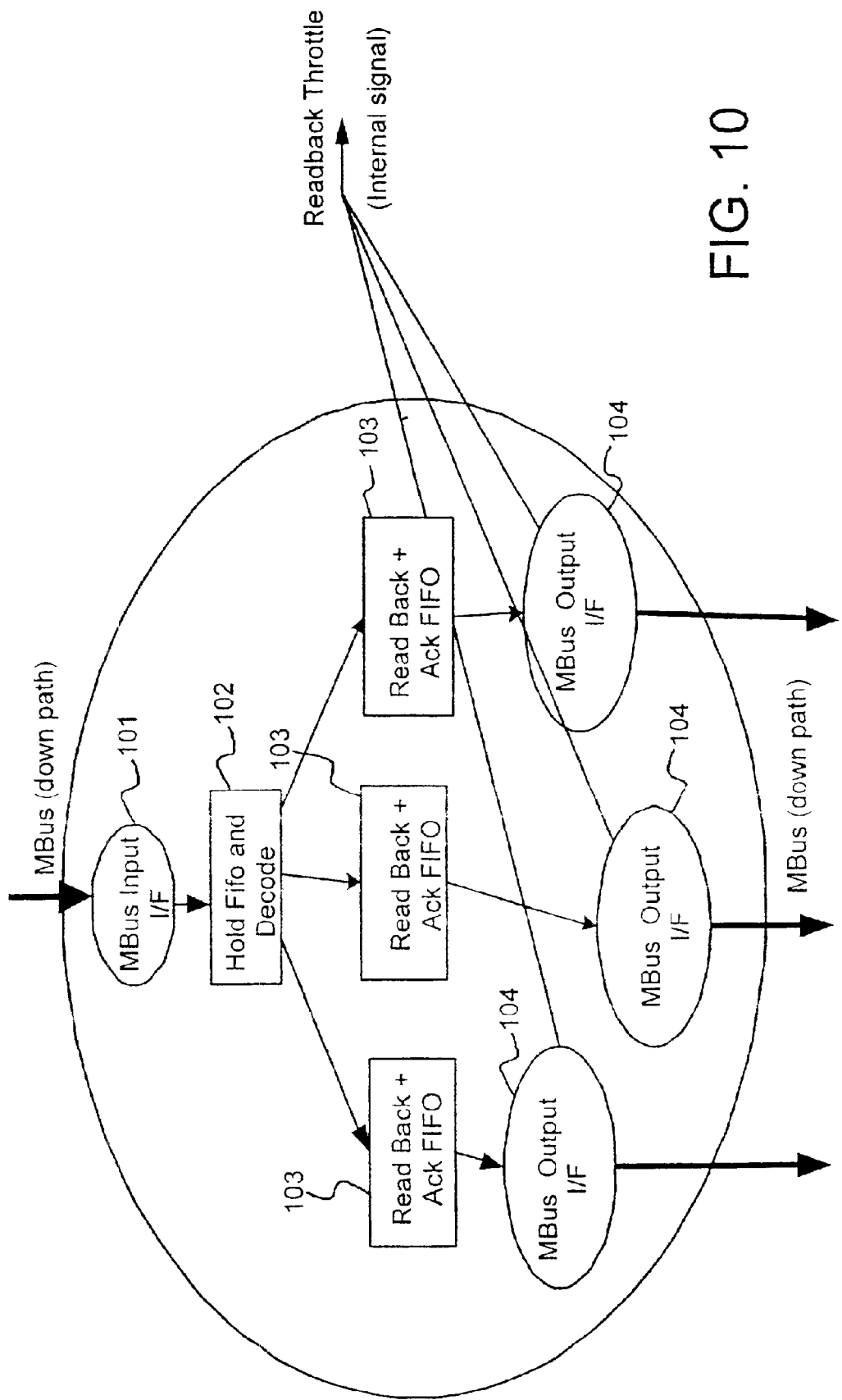
FIG. 10 is a further diagram illustrating arbitration functions

The mBus and rBus are point to point bi-directional buses that can operate in full or half duplex mode. When an arbitration block is drawn and an mBus is connected to one of its ports there are inferred upward and downward paths along the bus. Arbitration blocks must store multiple read and write requests on the upward path (from an mBus initiator) and multiple read responses and write acknowledgements on the downward path (from an mBus target). This split is shown in FIGS. 9 and 10 below. The two separate paths when combined constitute a complete arbitration block. For this reason a clock and register interface is only shown in the one of the bubbles.

The high-level upward path arbitration functions are shown in FIG. 9.

References 91 each denote an mBus input interface. The Verilog for this function can be created from a standard template that will be instantiated within the block the required number of times (in this example, three times). The signal names for each interface would be changed to ensure that they are unique. The mBus input interface clocks in mBus read and write requests on the correct edge and passes the data to the FIFO buffers.

References 92 each denote a FIFO buffer. The Verilog for this function can be created from a standard template that will be instantiated within the block the required number of times (three). The buffer sizes, dependent on the signals of rdCmdData, rdCmdPhase, wrInfo, wrPhase and wrData as described in application No. 0104828 3 are defined by passing a parameter into the function when it is instantiated. The FIFO stores the data associated with the mBus requests. It will stall the mBus input interface when it is full.

Reference 93 denotes an arbiter. The Verilog for this function can be generated using a state machine algorithm. The arbiter will grant access to the mBus output port based on this arbitration algorithm. An example of such an algorithm is one where an arbiter has a fixed number of slots and allocates slots to input ports based on their bandwidth allocation and priority parameters.

Reference 94 denotes 'mBus output port and decode'. The Verilog for this function can be created from a standard template. The signal names should be changed to ensure that they are unique. The mBus output port will pass mBus requests to the next level in the interconnect. The address of the mBus target to which access is desired is passed to the output port. The function is programmed with the range of addresses that it recognises. The mBus output port looks at each address passed to it and decides which select line (95) should be driven high.

Reference 95 denotes select lines. The top level arbitration block should be parameterised to define the number of select lines supported. The value of the parameter is equal to the number of times the mBus upward path is split (number of destinations–mBus target/mBus input ports).

Reference 96 denotes a clock interface. The Verilog for this function can be created from a standard template. The block's external signal names will be changed to ensure that they are unique. A similar template will be used in all the interconnect blocks (i.e. arb, wrapper bridge). The clock interface distributes the clock signal to all functions within the block. It will route the necessary sample and strobe signals to the mBus and rBus interfaces defined for this interconnect block. It will handle reset signals.

Reference 97 denotes a register target interface. The Verilog for this function can be created from a standard template that will be used only for creating arbitration block register target interfaces. The block's external signal names will be changed to ensure that they are unique. It will allow access to the configurable registers within the block.

The high-level downward path arbitration functions are shown in FIG. 10.

Reference 101 denotes an mBus input interface. The Verilog for this function can be created from a standard template that can be instantiated within the block the required number of times. The signal names for each interface will be changed to ensure that they are unique. The mBus input interface clocks in mBus read data and write acknowledgements on the correct edge and passes the data to the hold FIFO for decoding.

Reference 102 denotes hold FIFO+decode. The Verilog for this function can be created from a standard template, an instance is created for each input port on the downward path. The hold FIFO stores data while the source identifier is used to decide which output port the response is destined for.

Reference 103 denotes a FIFO. The Verilog for this function can be created from a standard template, an instance is created for each output port on the downward path. The buffer sizes are configurable and are dependant on signals rdDataPhase and rdData as described in application No. 0104828 3. The FIFO stores both read data and write acknowledgements. A read back throttle is sent to the upward path arbitration functions when the FIFO is full.

Reference 104 denotes an mBus output port. The Verilog for this function can be created from a standard template. The signal names will be changed to ensure that they are unique. The mBus output port will pass mBus responses to the next level down in the interconnect.

Figure 11:
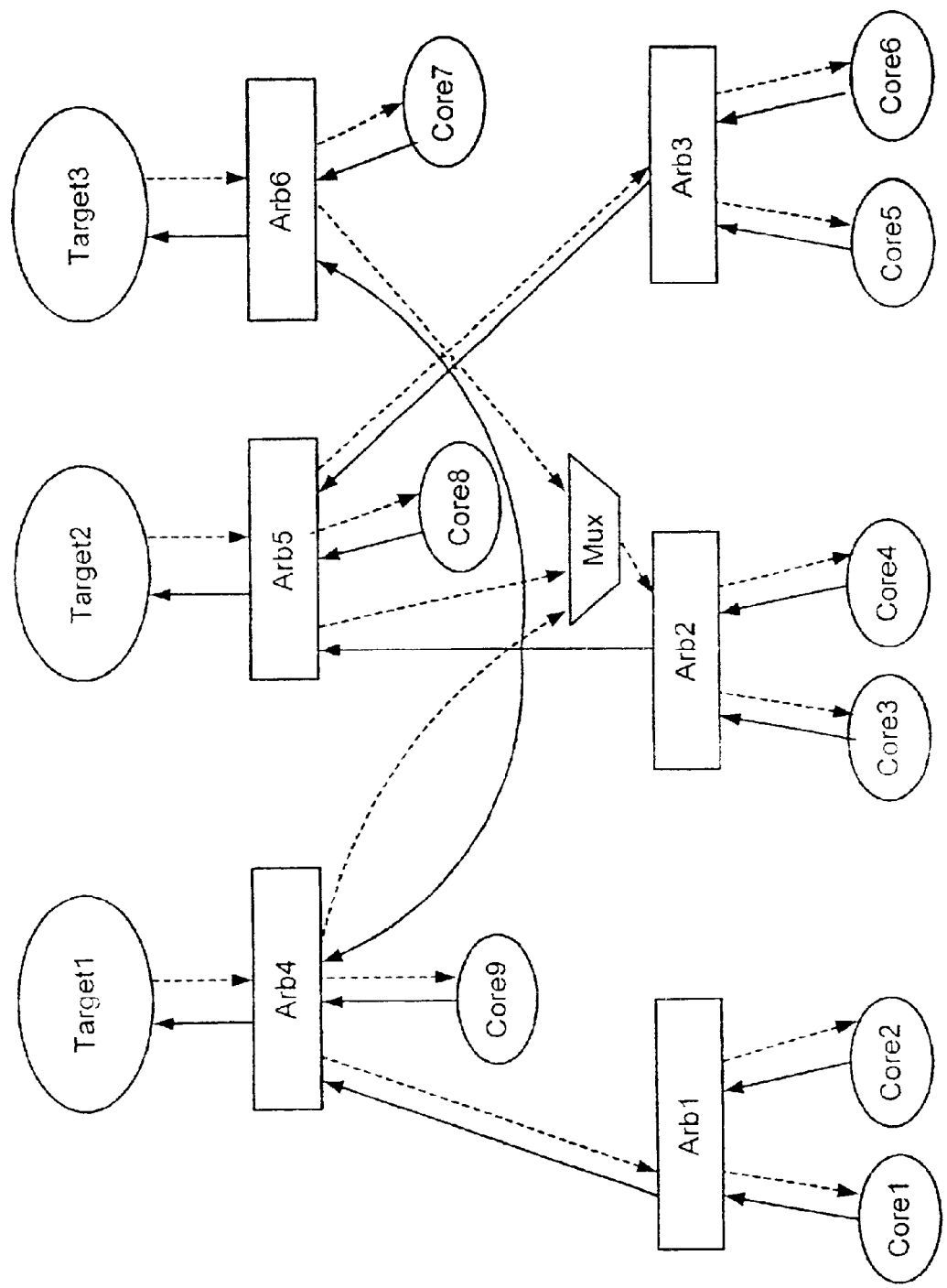
FIG. 11 is a diagram illustrating bus paths

FIG. 11 is a schematic diagram which represents the mBus paths for a system-on-a-chip. It includes elements which can be obtained from the library and elements which will have to be generated as part of the interconnect logic. FIG. 11 shows the upward paths (cores to target memory) and downward paths (memory to cores) of data transactions on the memory bus.

More particularly, FIG. 11 shows nine data handling cores, namely 'Core1' to 'Core9' and three memories denoted 'Target1', 'Target2' and 'Target3'. FIG. 11 shows a typical layout wherein 'Core1', 'Core2', 'Core3', 'Core4' and 'Core9' can read and write from 'Target1'. 'Core3', 'Core4', 'Core5', 'Core6' and 'Core8' can read and write from 'Target2'. 'Core3', 'Core4' and 'Core7' can read and write from 'Target3'. The solid upward mBus path extending from Arb2 is split 3 times to allow Arb2 to address the three separate memories. In all cases where the upward mBus path is split a multiplexer (Mux) is required on the downward path, as shown by the dashed lines extending from the arbitration stages 'Arb4', 'Arb5' and 'Arb6' by way of a multiplexer to the stage 'Arb2'. The arbitration and aggregation stages 'Arb1' to 'Arb6' are generated by the interconnect logic as described with reference to FIGS. 9 and 10. All required multiplexers are generated automatically.

Creation of Core Wrapper Logic

Preferably there are two core types that will be available in the library, viz an mBus initiator core (e.g. Ethernet, PCI, USB) and an mBus target core (e.g. SDRAM controller, flash controller). All cores contained in the library will need a wrapper similar to the ones described here in order to translate between the signal format and/or conventions employed within the core and the signal format and/or conventions employed on the memory bus (mBus) and/or the register bus (rBus). Each core will have its own unique requirements, therefore the wrapper will vary somewhat from core to core.

The following pseudo-code describes the high level steps used to create logic for an initiator core wrapper block. The parameters used in the creation of logic for a core are fully described previously.

NAME = Unique name for this Arbitration Block
MBUS_TARGETS= number of mBus targets
For (n=0) -> (n = MBUS_TARGETS-1)
    mBus Select Logic ( MBUS_TARGETS )

Figure 12:
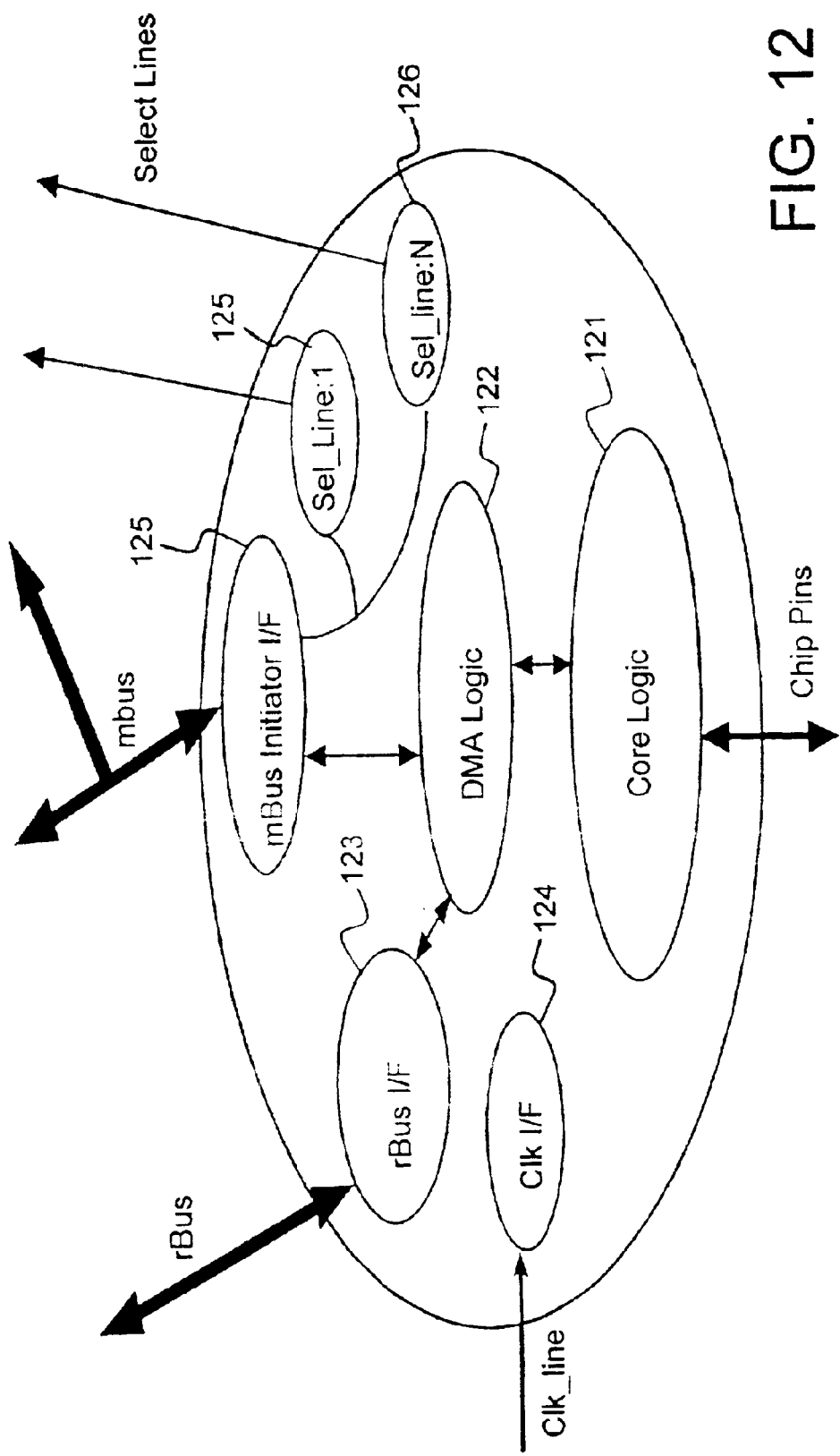
FIG. 12 is a diagram illustrating core wrapper functions

The high level core (mBus initiator) wrapper functions are shown in FIG. 12.

121 denotes the fundamental core logic. This is 'handcrafted' logic that is unique to each core. The tool will not modify this logic.

122 denotes a DMA engine, 'handcrafted logic' that is unique to the core. The tool will not modify this logic.

123 denotes an rBus target interface, 'handcrafted logic' that is unique to each core (logic in each core will be very similar). The tool will not modify this logic.

124 denotes a clock interface. The Verilog for this function can be created from a standard template. The block's external signal names will be changed to ensure that they are unique. A similar template will be used in all the interconnect blocks (i.e. arb, wrapper, bridge). The clock interface distributes the clock signal to all functions within the block. It will route the necessary sample and strobe signals to the mBus and rBus interfaces defined for this interconnect block. It will handle reset signals.

125 denotes an mBus initiator interface, 'handcrafted logic' that is unique to each core (logic in each core will be very similar). The tool will not modify this logic.

126 denotes a select line driver. The Verilog for this function can be created from a standard template. The signal names will be changed to ensure that they are unique. A similar template will be used to create the select line logic in the bridge, wrapper and arbiter blocks. The function will be parameterised with the range of memory addresses that it recognises. The select line driver looks at each address passed to it and decides if the select line should be driven high.

127 denotes select lines. The top-level wrapper block is parameterised to define the number of select lines supported. The value of the parameter is equal to the number of times the corresponding mBus upward path is split (number of destinations–mBus target/mBus input ports).

Figure 13:
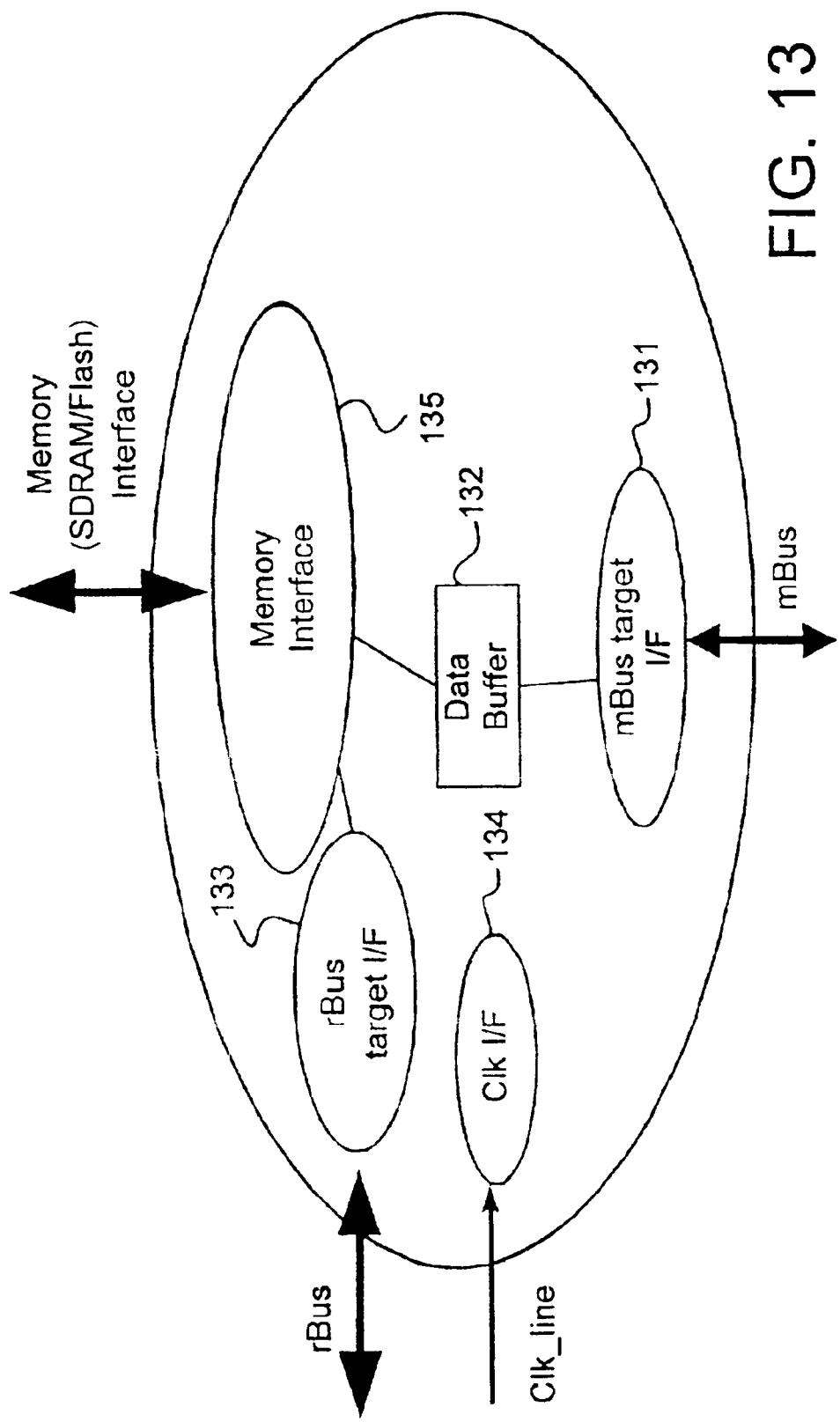
FIG. 13 is a diagram illustrating memory controller wrapper functions

The high level core (mBus target) wrapper functions are shown in FIG. 13.

131 denotes an mBus target interface. This will be logic that is unique to each core although the logic in each core will be similar. The tool will not modify this logic.

132 denotes a data buffer. This will be logic that is unique to the core. The tool will not modify this logic. The buffer stores posted read and write requests to assist in attaining maximum bandwidth efficiency.

133 denotes an rBus target interface. This will be logic that is unique to each core although the logic in each core will be similar. The tool will not modify this logic.

134 denotes a clock interface. The Verilog for this function can be created from a standard template. The block's external signal names will be changed to ensure that they are unique. A similar template will be used in all the interconnect blocks (i.e. arb, wrapper, bridge). The clock interface 134 distributes the clock signal to all functions within the block. It will route the necessary sample and strobe signals to the mBus and rBus interfaces defined for this interconnect block. It will handle reset signals.

135 denotes the core logic. This is logic that is unique to each core. The memory controller can be configured to interface to different size memories (8, 16, 32) so long as the memory provides the same functionality.

All core wrapper blocks will be designed with an rBus interface and one or more mBus interfaces. In addition a single mBus can be split to multiple destinations using select lines. The cores will then be incorporated into the library and can be used in a multiplicity of different designs. In a design it may be decided that a particular interface is not needed (i.e. only communicate with a UART block over the rBus). The compiler will automatically handle the circumstances where signals need to be tied off.

Addition to Instantiation File

The interconnect logic generated will be completely 'flat', i.e. all blocks will be instantiated at the same level. One top-level instantiation file will be created. Each block within the interconnect will be listed in the file. The top-level input and output signals will be extracted from each of the interconnect blocks and declared in the top-level instantiation file. The following information will be extracted for each signal.

(a) Signal Name
(b) Signal Width
(c) Signal Direction
(d) Is it an External Signal (Pin out)
(e) Value to tie an Input signal to if it is unused The parameters described previously will be declared and passed into each of the interconnect blocks. The following section contains an example of a Verilog module and how that module would be declared at a higher level.

The following shows an example of a Verilog module and a top level instantiation file.

```
module foo (in_sig, clk, rst, out_sig);
    input in_sig; wire in_sig;
    input clk; wire clk;
    input rst; wire rst;
    output out_sig; reg out_sig;
    always @ (posedge clk)
    begin
module foo_test_top;
    reg SystemClock;
    wire in_sig;
    wire clk;
    wire rst;
    wire out_sig;
```

Sample Verilog

The following is some exemplary Verilog showing the type of Verilog that will generate for the clock state machine.

```
module strobe_generation ( clk. RESET. clk2. strobe[TARGET_TOTAL-1:0],
                           clrStrobe[TARGET_TOTAL-1.0]
                           sample[TARGET_TOTAL-1.0]):
parameter TARGET_TOTAL = 2. // Parameters
input parent_clk
parameter [2 0] State0 = 29*b0. State1 = 29*b10. State2 = 29b*100.
reg [2 0]  current_state.next_state.
always @(RESET)
begin Start0_comb
        strobe_next <= strobe.
        clrStrobe_next <= clrStrobe.
        sample_next <= sample.
        if (RESET == 1)
            begin strobe = 0. sample = 0. clrStrobe = 0: next_state = State1: end
        else begin
            case (current_state)
                State0
                    begin clk2 <= 0. strobe <= 2*b00. clrStrobe <= 2*b10.
                        sample <= 2*b11. next_state <= State1. end
                State1
                    begin clk2 <= 1. strobe <= 2*b00. clrStrobe <= 2*b10.
                        sample <= 2*b11. next_state <= State2. end
```

-continued

```
                State2
                    begin clk2 <= 0. strobe <= 2*b10. clrStrobe <= 2*b01.
                        sample <= 2*b00. next_state <= State3. end
                    default
                    begin next_state <= State0. end
                endcase
            end
        end
end module
```

What is claimed is:

1. A program tool for the generation of a large scale integrated circuit, said tool comprising the steps of
    (a) defining an architecture comprising a multiplicity of data handling cores and at least one shared memory system
    (b) defining interconnect logic separately from said cores, said interconnect logic defining, in accordance with data transfer requirements of said cores, data paths that require data transfers between cores to proceed by way of a shared memory system.

2. A program tool according to claim 1 wherein said interconnect logic prescribes a hierarchy of data aggregation whereby each core is coupled to a memory by way of at least one level of arbitration and at least some cores are coupled to said memory by way of at least two levels of arbitration.

3. A program tool according to claim 1 and wherein the tool provides the step of defining register paths separate from data transfer paths and proceeding between data processor cores and others of said cores.

4. A program tool according to claim 1 and wherein the tool provides the step of defining control paths separate from data transfer paths.

5. A program tool according claim 1 and wherein the tool further comprises the steps of:
    obtaining said cores from a library of cores, and
    defining parameters for each of said cores.

6. A program tool for the generation of a large scale integrated circuit, said tool comprising the steps of
    (a) defining an architecture comprising a multiplicity of data handling cores and at least one shared memory system
    (b) obtaining said cores from a library of cores
    (c) defining interconnect parameters for each of said cores, and
    (d) configuring automatically in accordance with said parameters interconnect logic separately from said cores, said interconnect logic defining data transfer paths that require data exchanges between cores to proceed by way of at least one shared memory system.

7. A program tool according to claim 6 and wherein the tool provides the step of defining register paths separate from the data transfer paths and proceeding between data processor cores and others of said cores.

8. A program tool according to claim 7 and wherein the tool provides the step of defining control paths separate from the data transfer paths.

9. A program tool according to claim 6 wherein said interconnect logic prescribes a hierarchy of data aggregation whereby each core is coupled to said memory by way of at least one level of arbitration and at least some cores are coupled to said memory by way of at least two levels of arbitration.

10. A program tool according to claim 6 and further comprising reprogramming said interconnect parameters to optimize a layout for said circuit.

* * * * *